US012785612B2

(12) United States Patent
Bunea et al.

(10) Patent No.: US 12,785,612 B2
(45) Date of Patent: Nov. 3, 2026

(54) PHOTOVOLTAIC MODULE WITH INTEGRATED WIREWAY

(71) Applicant: GAF Energy LLC, Parsippany, NJ (US)

(72) Inventors: Gabriela Bunea, San Jose, CA (US); Thierry Nguyen, San Francisco, CA (US); Richard Perkins, San Jose, CA (US); Dan Hua, San Jose, CA (US); David Kavulak, San Francisco, CA (US); Emma Dohner, Menlo Park, CA (US); Peter Wilke, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 19/024,336

(22) Filed: Jan. 16, 2025

(65) Prior Publication Data

US 2025/0233547 A1 Jul. 17, 2025

Related U.S. Application Data

(60) Provisional application No. 63/621,474, filed on Jan. 16, 2024.

(51) Int. Cl.
*H02S 20/23* (2014.01)
*H10F 19/80* (2025.01)

(52) U.S. Cl.
CPC ............. *H02S 20/23* (2014.12); *H10F 19/80* (2025.01)

(58) Field of Classification Search
CPC ........... H02S 40/36; H02S 40/00; H10F 19/80
See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |

(Continued)

FOREIGN PATENT DOCUMENTS

| | | |
|---|---|---|
| CA | 2829440 A | 5/2019 |
| CH | 700095 A2 | 6/2010 |

(Continued)

OTHER PUBLICATIONS

Sunflare, Procducts: “Sunflare Develops Prototype for New Residential Solar Shingles”; 2019 <<sunflaresolar.com/news/sunflare-develops-prototype-for-new-residential-solar-shingles>> retrieved Feb. 2, 2021.

(Continued)

*Primary Examiner* — Christina Chern
(74) *Attorney, Agent, or Firm* — GREENBERG TRAURIG, LLP

(57) ABSTRACT

A system includes a first photovoltaic module and a second photovoltaic module installed and arranged in an array on the roof deck. Each of the photovoltaic modules includes a first end, a second end opposite the first end, and a first location between the first end and the second end, a first plurality of solar cells, a second plurality of solar cells, an encapsulant layer encapsulating the first and second plurality of solar cells, a frontsheet, and a backsheet. The photovoltaic modules include a first portion and a second portion. The first portion extends between the first end and the first location, and the second portion extends between the first location and the second end. The second portion includes a wireway. The first plurality of solar cells is positioned within the first portion, and the second plurality of solar cells is positioned within the second portion.

15 Claims, 15 Drawing Sheets

(56) References Cited

U.S. PATENT DOCUMENTS

| | | | |
|---|---|---|---|
| 3,581,779 | A | 6/1971 | Gilbert, Jr. |
| 4,258,948 | A | 3/1981 | Hoffmann |
| 4,349,220 | A | 9/1982 | Carroll et al. |
| 4,499,702 | A | 2/1985 | Turner |
| 4,636,577 | A | 1/1987 | Peterpaul |
| 5,167,579 | A | 12/1992 | Rotter |
| 5,437,735 | A | 8/1995 | Younan et al. |
| 5,590,495 | A | 1/1997 | Bressler et al. |
| 5,642,596 | A | 7/1997 | Waddington |
| 6,008,450 | A | 12/1999 | Ohtsuka et al. |
| 6,033,270 | A | 3/2000 | Stuart |
| 6,046,399 | A | 4/2000 | Kapner |
| 6,201,180 | B1 | 3/2001 | Meyer et al. |
| 6,220,329 | B1 | 4/2001 | King et al. |
| 6,308,482 | B1 | 10/2001 | Strait |
| 6,311,436 | B1 | 11/2001 | Mimura et al. |
| 6,320,114 | B1 | 11/2001 | Kuechler |
| 6,320,115 | B1 | 11/2001 | Kataoka et al. |
| 6,336,304 | B1 | 1/2002 | Mimura et al. |
| 6,341,454 | B1 | 1/2002 | Koleoglou |
| 6,407,329 | B1 | 6/2002 | Iino et al. |
| 6,576,830 | B2 | 6/2003 | Nagao et al. |
| 6,928,781 | B2 | 8/2005 | Desbois et al. |
| 6,972,367 | B2 | 12/2005 | Federspiel et al. |
| 7,138,578 | B2 | 11/2006 | Komamine |
| 7,155,870 | B2 | 1/2007 | Almy |
| 7,178,295 | B2 | 2/2007 | Dinwoodie |
| 7,487,771 | B1 | 2/2009 | Eiffert et al. |
| 7,587,864 | B2 | 9/2009 | McCaskill et al. |
| 7,678,990 | B2 | 3/2010 | McCaskill et al. |
| 7,678,991 | B2 | 3/2010 | McCaskill et al. |
| 7,748,191 | B2 | 7/2010 | Podirsky |
| 7,819,114 | B2 | 10/2010 | Augenbraun et al. |
| 7,824,191 | B1 | 11/2010 | Podirsky |
| 7,832,176 | B2 | 11/2010 | McCaskill et al. |
| 8,118,109 | B1 | 2/2012 | Hacker |
| 8,168,880 | B2 | 5/2012 | Jacobs et al. |
| 8,173,889 | B2 | 5/2012 | Kalkanoglu et al. |
| 8,210,570 | B1 | 7/2012 | Railkar et al. |
| 8,276,329 | B2 | 10/2012 | Lenox |
| 8,312,693 | B2 | 11/2012 | Cappelli |
| 8,319,093 | B2 | 11/2012 | Kalkanoglu et al. |
| 8,333,040 | B2 | 12/2012 | Shiao et al. |
| 8,371,076 | B2 | 2/2013 | Jones et al. |
| 8,375,653 | B2 | 2/2013 | Shiao et al. |
| 8,404,967 | B2 | 3/2013 | Kalkanoglu et al. |
| 8,410,349 | B2 | 4/2013 | Kalkanoglu et al. |
| 8,418,415 | B2 | 4/2013 | Shiao et al. |
| 8,438,796 | B2 | 5/2013 | Shiao et al. |
| 8,468,754 | B2 | 6/2013 | Railkar et al. |
| 8,468,757 | B2 | 6/2013 | Krause et al. |
| 8,505,249 | B2 | 8/2013 | Geary |
| 8,512,866 | B2 | 8/2013 | Taylor |
| 8,513,517 | B2 | 8/2013 | Kalkanoglu et al. |
| 8,586,856 | B2 | 11/2013 | Kalkanoglu et al. |
| 8,601,754 | B2 | 12/2013 | Jenkins et al. |
| 8,629,578 | B2 | 1/2014 | Kurs et al. |
| 8,646,228 | B2 | 2/2014 | Jenkins |
| 8,656,657 | B2 | 2/2014 | Livsey et al. |
| 8,671,630 | B2 | 3/2014 | Lena et al. |
| 8,677,702 | B2 | 3/2014 | Jenkins |
| 8,695,289 | B2 | 4/2014 | Koch et al. |
| 8,713,858 | B1 | 5/2014 | Xie |
| 8,713,860 | B2 | 5/2014 | Railkar et al. |
| 8,733,038 | B2 | 5/2014 | Kalkanoglu et al. |
| 8,776,455 | B2 | 7/2014 | Azoulay |
| 8,789,321 | B2 | 7/2014 | Ishida |
| 8,793,940 | B2 | 8/2014 | Kalkanoglu et al. |
| 8,793,941 | B2 | 8/2014 | Bosler et al. |
| 8,826,607 | B2 | 9/2014 | Shiao et al. |
| 8,835,751 | B2 | 9/2014 | Kalkanoglu et al. |
| 8,863,451 | B2 | 10/2014 | Jenkins et al. |
| 8,898,970 | B2 | 12/2014 | Jenkins et al. |
| 8,925,262 | B2 | 1/2015 | Railkar et al. |
| 8,943,766 | B2 | 2/2015 | Gombarick et al. |
| 8,946,544 | B2 | 2/2015 | Jabos et al. |
| 8,950,128 | B2 | 2/2015 | Kalkanoglu et al. |
| 8,959,848 | B2 | 2/2015 | Jenkins et al. |
| 8,966,838 | B2 | 3/2015 | Jenkins |
| 8,966,850 | B2 | 3/2015 | Jenkins et al. |
| 8,994,224 | B2 | 3/2015 | Mehta et al. |
| 9,032,672 | B2 | 5/2015 | Livsey et al. |
| 9,121,178 | B2 | 9/2015 | Belt et al. |
| 9,153,950 | B2 | 10/2015 | Yamanaka et al. |
| 9,166,087 | B2 | 10/2015 | Chihlas et al. |
| 9,169,646 | B2 | 10/2015 | Rodrigues et al. |
| 9,170,034 | B2 | 10/2015 | Bosler et al. |
| 9,178,465 | B2 | 11/2015 | Shiao et al. |
| 9,202,955 | B2 | 12/2015 | Livsey et al. |
| 9,212,832 | B2 | 12/2015 | Jenkins |
| 9,217,584 | B2 | 12/2015 | Kalkanoglu et al. |
| 9,270,221 | B2 | 2/2016 | Zhao |
| 9,273,885 | B2 | 3/2016 | Rodrigues et al. |
| 9,276,141 | B2 | 3/2016 | Kalkanoglu et al. |
| 9,331,224 | B2 | 5/2016 | Koch et al. |
| 9,356,174 | B2 | 5/2016 | Duarte et al. |
| 9,359,014 | B1 | 6/2016 | Yang et al. |
| 9,412,890 | B1 | 8/2016 | Meyers |
| 9,528,270 | B2 | 12/2016 | Jenkins et al. |
| 9,605,432 | B1 | 3/2017 | Robbins |
| 9,711,672 | B2 | 7/2017 | Wang |
| 9,755,573 | B2 | 9/2017 | Livsey et al. |
| 9,786,802 | B2 | 10/2017 | Shiao et al. |
| 9,831,818 | B2 | 11/2017 | West |
| 9,912,284 | B2 | 3/2018 | Svec |
| 9,923,515 | B2 | 3/2018 | Rodrigues et al. |
| 9,938,729 | B2 | 4/2018 | Coon |
| 9,991,412 | B2 | 6/2018 | Gonzalez et al. |
| 9,998,067 | B2 | 6/2018 | Kalkanoglu et al. |
| 10,027,273 | B2 | 7/2018 | West et al. |
| 10,115,850 | B2 | 10/2018 | Rodrigues et al. |
| 10,128,660 | B1 | 11/2018 | Apte et al. |
| 10,156,075 | B1 | 12/2018 | McDonough |
| 10,187,005 | B2 | 1/2019 | Rodrigues et al. |
| 10,256,765 | B2 | 4/2019 | Rodrigues et al. |
| 10,284,136 | B1 | 5/2019 | Mayfield et al. |
| 10,454,408 | B2 | 10/2019 | Livsey et al. |
| 10,530,292 | B1 | 1/2020 | Cropper et al. |
| 10,560,048 | B2 | 2/2020 | Fisher et al. |
| 10,563,406 | B2 | 2/2020 | Kalkanoglu et al. |
| D879,031 | S | 3/2020 | Lance et al. |
| 10,579,028 | B1 | 3/2020 | Jacob |
| 10,784,813 | B2 | 9/2020 | Kalkanoglu et al. |
| D904,289 | S | 12/2020 | Lance et al. |
| 11,012,026 | B2 | 5/2021 | Kalkanoglu et al. |
| 11,085,187 | B2 | 8/2021 | Grubka et al. |
| 11,177,639 | B1 | 11/2021 | Nguyen et al. |
| 11,217,715 | B2 | 1/2022 | Sharenko et al. |
| 11,251,744 | B1 | 2/2022 | Bunea et al. |
| 11,258,399 | B2 | 2/2022 | Kalkanoglu et al. |
| 11,283,394 | B2 | 3/2022 | Perkins et al. |
| 11,309,828 | B2 | 4/2022 | Sirski et al. |
| 11,394,344 | B2 | 7/2022 | Perkins et al. |
| 11,424,379 | B2 | 8/2022 | Sharenko et al. |
| 11,431,280 | B2 | 8/2022 | Liu et al. |
| 11,431,281 | B2 | 8/2022 | Perkins et al. |
| 11,444,569 | B2 | 9/2022 | Clemente et al. |
| 11,454,027 | B2 | 9/2022 | Kuiper et al. |
| 11,459,757 | B2 | 10/2022 | Nguyen et al. |
| 11,486,144 | B2 | 11/2022 | Bunea et al. |
| 11,489,482 | B2 | 11/2022 | Peterson et al. |
| 11,496,088 | B2 | 11/2022 | Sirski et al. |
| 11,508,861 | B1 | 11/2022 | Perkins et al. |
| 11,512,480 | B1 | 11/2022 | Achor et al. |
| 11,527,665 | B2 | 12/2022 | Boitnott |
| 11,545,927 | B2 | 1/2023 | Abra et al. |
| 11,545,928 | B2 | 1/2023 | Perkins et al. |
| 11,658,470 | B2 | 5/2023 | Nguyen et al. |
| 11,661,745 | B2 | 5/2023 | Bunea et al. |
| 11,689,149 | B2 | 6/2023 | Clemente et al. |
| 11,705,531 | B2 | 7/2023 | Sharenko et al. |
| 11,728,759 | B2 | 8/2023 | Nguyen et al. |
| 11,732,490 | B2 | 8/2023 | Achor et al. |
| 11,811,361 | B1 | 11/2023 | Farhangi et al. |

(56) References Cited

U.S. PATENT DOCUMENTS

| | | | | |
|---|---|---|---|---|
| 11,824,486 | B2 | 11/2023 | Nguyen et al. | |
| 11,824,487 | B2 | 11/2023 | Nguyen et al. | |
| 11,843,067 | B2 | 12/2023 | Nguyen et al. | |
| 2002/0053360 | A1 | 5/2002 | Kinoshita et al. | |
| 2002/0129849 | A1 | 9/2002 | Heckeroth | |
| 2003/0101662 | A1 | 6/2003 | Ullman | |
| 2003/0132265 | A1 | 7/2003 | Villela et al. | |
| 2003/0217768 | A1 | 11/2003 | Guha | |
| 2004/0000334 | A1 | 1/2004 | Ressler | |
| 2005/0030187 | A1 | 2/2005 | Peress et al. | |
| 2005/0115603 | A1 | 6/2005 | Yoshida et al. | |
| 2005/0144870 | A1 | 7/2005 | Dinwoodie | |
| 2005/0178428 | A1 | 8/2005 | Laaly et al. | |
| 2005/0193673 | A1 | 9/2005 | Rodrigues et al. | |
| 2006/0042683 | A1 | 3/2006 | Gangemi | |
| 2006/0046084 | A1 | 3/2006 | Yang et al. | |
| 2007/0074757 | A1 | 4/2007 | Mellott et al. | |
| 2007/0181174 | A1 | 8/2007 | Ressler | |
| 2007/0193618 | A1 | 8/2007 | Bressler et al. | |
| 2007/0249194 | A1 | 10/2007 | Liao | |
| 2007/0295385 | A1 | 12/2007 | Sheats et al. | |
| 2008/0006323 | A1 | 1/2008 | Kalkanoglu et al. | |
| 2008/0035140 | A1 | 2/2008 | Placer et al. | |
| 2008/0078440 | A1 | 4/2008 | Lim et al. | |
| 2008/0185748 | A1 | 8/2008 | Kalkanoglu | |
| 2008/0271774 | A1 | 11/2008 | Kalkanoglu et al. | |
| 2008/0289682 | A1 | 11/2008 | Adriani et al. | |
| 2008/0302030 | A1 | 12/2008 | Stancel et al. | |
| 2008/0315061 | A1 | 12/2008 | Fath | |
| 2009/0000222 | A1 | 1/2009 | Kalkanoglu et al. | |
| 2009/0014057 | A1 | 1/2009 | Croft et al. | |
| 2009/0014058 | A1 | 1/2009 | Croft et al. | |
| 2009/0019795 | A1 | 1/2009 | Szacsvay et al. | |
| 2009/0044850 | A1 | 2/2009 | Kimberley | |
| 2009/0114261 | A1 | 5/2009 | Stancel et al. | |
| 2009/0133340 | A1 | 5/2009 | Shiao et al. | |
| 2009/0159118 | A1 | 6/2009 | Kalkanoglu et al. | |
| 2009/0178350 | A1 | 7/2009 | Kalkanoglu et al. | |
| 2009/0229652 | A1 | 9/2009 | Mapel et al. | |
| 2009/0275247 | A1 | 11/2009 | Richter et al. | |
| 2010/0019580 | A1 | 1/2010 | Croft et al. | |
| 2010/0095618 | A1 | 4/2010 | Edison et al. | |
| 2010/0101634 | A1 | 4/2010 | Frank et al. | |
| 2010/0116325 | A1 | 5/2010 | Nikoonahad | |
| 2010/0131108 | A1 | 5/2010 | Meyer | |
| 2010/0139184 | A1 | 6/2010 | Williams et al. | |
| 2010/0146878 | A1 | 6/2010 | Koch et al. | |
| 2010/0159221 | A1 | 6/2010 | Kourtakis et al. | |
| 2010/0170169 | A1 | 7/2010 | Railkar et al. | |
| 2010/0186798 | A1 | 7/2010 | Tormen et al. | |
| 2010/0242381 | A1 | 9/2010 | Jenkins | |
| 2010/0313499 | A1 | 12/2010 | Gangemi | |
| 2010/0325976 | A1 | 12/2010 | DeGenfelder et al. | |
| 2010/0326488 | A1 | 12/2010 | Aue et al. | |
| 2010/0326501 | A1 | 12/2010 | Zhao et al. | |
| 2011/0030761 | A1 | 2/2011 | Kalkanoglu et al. | |
| 2011/0036386 | A1 | 2/2011 | Browder | |
| 2011/0036389 | A1 | 2/2011 | Hardikar et al. | |
| 2011/0048507 | A1 | 3/2011 | Livsey et al. | |
| 2011/0058337 | A1 | 3/2011 | Han et al. | |
| 2011/0061326 | A1 | 3/2011 | Jenkins | |
| 2011/0100436 | A1 | 5/2011 | Cleereman et al. | |
| 2011/0104488 | A1 | 5/2011 | Muessig et al. | |
| 2011/0132427 | A1 | 6/2011 | Kalkanoglu et al. | |
| 2011/0168238 | A1 | 7/2011 | Metin et al. | |
| 2011/0239555 | A1 | 10/2011 | Cook et al. | |
| 2011/0302859 | A1 | 12/2011 | Crasnianski | |
| 2011/0314753 | A1 | 12/2011 | Farmer et al. | |
| 2012/0034799 | A1 | 2/2012 | Hunt | |
| 2012/0060434 | A1 | 3/2012 | Jacobs | |
| 2012/0060902 | A1 | 3/2012 | Drake | |
| 2012/0085392 | A1 | 4/2012 | Albert et al. | |
| 2012/0137600 | A1 | 6/2012 | Jenkins | |
| 2012/0176077 | A1 | 7/2012 | Oh et al. | |
| 2012/0212065 | A1 | 8/2012 | Cheng et al. | |
| 2012/0233940 | A1 | 9/2012 | Perkins et al. | |
| 2012/0240490 | A1 | 9/2012 | Gangemi | |
| 2012/0260977 | A1 | 10/2012 | Stancel | |
| 2012/0266942 | A1 | 10/2012 | Komatsu et al. | |
| 2012/0279150 | A1 | 11/2012 | Pislkak et al. | |
| 2012/0282437 | A1 | 11/2012 | Clark et al. | |
| 2012/0291848 | A1 | 11/2012 | Sherman et al. | |
| 2013/0008499 | A1 | 1/2013 | Verger et al. | |
| 2013/0014455 | A1 | 1/2013 | Grieco | |
| 2013/0118558 | A1 | 5/2013 | Sherman | |
| 2013/0193769 | A1 | 8/2013 | Mehta et al. | |
| 2013/0247988 | A1 | 9/2013 | Reese et al. | |
| 2013/0284267 | A1 | 10/2013 | Plug et al. | |
| 2013/0306137 | A1 | 11/2013 | Ko | |
| 2014/0090697 | A1 | 4/2014 | Rodrigues et al. | |
| 2014/0150843 | A1 | 6/2014 | Pearce et al. | |
| 2014/0173997 | A1 | 6/2014 | Jenkins | |
| 2014/0179220 | A1 | 6/2014 | Railkar et al. | |
| 2014/0182222 | A1 | 7/2014 | Kalkanoglu et al. | |
| 2014/0208675 | A1 | 7/2014 | Beerer et al. | |
| 2014/0254776 | A1 | 9/2014 | O'Connor et al. | |
| 2014/0266289 | A1 | 9/2014 | Della Sera et al. | |
| 2014/0311556 | A1 | 10/2014 | Feng et al. | |
| 2014/0352760 | A1 | 12/2014 | Haynes et al. | |
| 2014/0366464 | A1 | 12/2014 | Rodrigues et al. | |
| 2015/0089895 | A1 | 4/2015 | Leitch | |
| 2015/0162459 | A1 | 6/2015 | Lu et al. | |
| 2015/0340516 | A1 | 11/2015 | Kim et al. | |
| 2015/0349173 | A1 | 12/2015 | Morad et al. | |
| 2016/0105144 | A1 | 4/2016 | Haynes et al. | |
| 2016/0142008 | A1 | 5/2016 | Lopez et al. | |
| 2016/0254776 | A1 | 9/2016 | Rodrigues et al. | |
| 2016/0276508 | A1 | 9/2016 | Huang et al. | |
| 2016/0359451 | A1 | 12/2016 | Mao et al. | |
| 2017/0159292 | A1 | 6/2017 | Chihlas et al. | |
| 2017/0179319 | A1 | 6/2017 | Yamashita et al. | |
| 2017/0179726 | A1 | 6/2017 | Garrity et al. | |
| 2017/0237390 | A1 | 8/2017 | Hudson et al. | |
| 2017/0331415 | A1 | 11/2017 | Koppi et al. | |
| 2018/0094438 | A1 | 4/2018 | Wu et al. | |
| 2018/0097472 | A1 | 4/2018 | Anderson et al. | |
| 2018/0115275 | A1 | 4/2018 | Flanigan et al. | |
| 2018/0254738 | A1 | 9/2018 | Yang et al. | |
| 2018/0294765 | A1 | 10/2018 | Friedrich et al. | |
| 2018/0331241 | A1* | 11/2018 | Gaume | B32B 37/12 |
| 2018/0351502 | A1 | 12/2018 | Almy et al. | |
| 2018/0367089 | A1 | 12/2018 | Stutterheim et al. | |
| 2019/0030867 | A1 | 1/2019 | Sun et al. | |
| 2019/0081436 | A1 | 3/2019 | Onodi et al. | |
| 2019/0123679 | A1 | 4/2019 | Rodrigues et al. | |
| 2019/0253022 | A1 | 8/2019 | Hardar et al. | |
| 2019/0305717 | A1 | 10/2019 | Allen et al. | |
| 2020/0109320 | A1 | 4/2020 | Jiang | |
| 2020/0144958 | A1 | 5/2020 | Rodrigues et al. | |
| 2020/0220819 | A1 | 7/2020 | Vu et al. | |
| 2020/0224419 | A1 | 7/2020 | Boss et al. | |
| 2020/0343397 | A1 | 10/2020 | Hem-Jensen | |
| 2021/0083619 | A1 | 3/2021 | Hegedus | |
| 2021/0115223 | A1 | 4/2021 | Bonekamp et al. | |
| 2021/0159353 | A1 | 5/2021 | Li et al. | |
| 2021/0301536 | A1 | 9/2021 | Baggs et al. | |
| 2021/0343886 | A1 | 11/2021 | Sharenko et al. | |
| 2022/0060141 | A1 | 2/2022 | Felton | |
| 2022/0149213 | A1 | 5/2022 | Mensink et al. | |
| 2022/0360211 | A1* | 11/2022 | Griffith | H02S 30/10 |
| 2023/0283054 | A1 | 9/2023 | Bunea et al. | |
| 2024/0291427 | A1 | 8/2024 | Perkins et al. | |

FOREIGN PATENT DOCUMENTS

| | | | |
|---|---|---|---|
| CN | 202797032 | U | 3/2013 |
| CN | 217150978 | U | 8/2022 |
| DE | 1958248 | A1 | 11/1971 |
| EP | 1039361 | A1 | 9/2000 |
| EP | 1837162 | A1 | 9/2007 |
| EP | 1774372 | A1 | 7/2011 |
| EP | 2446481 | A2 | 5/2012 |
| EP | 2784241 | A1 | 10/2014 |
| EP | 3772175 | A1 | 2/2021 |

(56) References Cited

FOREIGN PATENT DOCUMENTS

| | | | |
|---|---|---|---|
| JP | 10046767 | A | 2/1998 |
| JP | 11-195805 | A | 7/1999 |
| JP | 2002-106151 | A | 4/2002 |
| JP | 2001-098703 | A | 10/2002 |
| JP | 2017-027735 | A | 2/2017 |
| JP | 2018053707 | A | 4/2018 |
| KR | 20090084060 | A | 8/2009 |
| KR | 10-1348283 | B1 | 1/2014 |
| KR | 10-2019-0000367 | A | 1/2019 |
| KR | 10-2253483 | B1 | 5/2021 |
| NL | 2026856 | B1 | 6/2022 |
| WO | 2010/151777 | A2 | 12/2010 |
| WO | 2011/049944 | A1 | 4/2011 |
| WO | 2015/133632 | A1 | 9/2015 |
| WO | 2018/000589 | A1 | 1/2018 |
| WO | 2019/201416 | A1 | 10/2019 |
| WO | 2020-159358 | A1 | 8/2020 |
| WO | 2021-247098 | A1 | 12/2021 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

PHOTOVOLTAIC MODULE WITH INTEGRATED WIREWAY

CROSS-REFERENCE TO RELATED APPLICATION

This application is a Section 111(a) application relating to and claiming the benefit of commonly owned, U.S. Provisional Patent Application Ser. No. 63/621,474, filed Jan. 16, 2024, entitled "ROOFING SYSTEM INCLUDING PHOTOVOLTAIC MODULE," the contents of which is incorporated herein by reference in its entirety.

FIELD

The present invention is directed to a roofing system, and, more specifically, to a roofing system that includes a plurality of photovoltaic modules installed on a roof deck.

BACKGROUND

In a known roofing system, a plurality of photovoltaic modules and a plurality of non-photovoltaic modules (e.g., roofing shingles) are installed on a sloped roof deck.

SUMMARY

The Claims, rather than the Summary, define covered embodiments of the present invention. The Summary is a high-level overview of various aspects of the invention, and introduces concepts that are further described in the Detailed Description below. The Summary is not intended to identify key or essential features of the claimed subject matter, and also is not intended to be used in isolation to determine the scope of the claimed subject matter. Instead, the claimed subject matter should be understood by reference to appropriate portions of the Specification and drawings, as well as to each claim.

In some embodiments, the present invention provides a system, comprising: a plurality of photovoltaic modules installed on a roof deck, wherein the plurality of photovoltaic modules includes at least a first photovoltaic module and a second photovoltaic module, wherein the first photovoltaic module and the second photovoltaic module are arranged in an array on the roof deck, wherein each of the plurality of photovoltaic modules comprises: a first end, a second end opposite the first end, and a first location between the first end and the second end; a first plurality of solar cells; a second plurality of solar cells, wherein the first plurality of solar cells in in electrical connection with the second plurality of solar cells; an encapsulant layer, wherein the encapsulant layer encapsulates the first plurality of solar cells and the second plurality of solar cells; a frontsheet, wherein the frontsheet is above an upper surface of the encapsulant layer; a backsheet, wherein the backsheet is below a lower surface of the encapsulant layer; and a first portion and a second portion, wherein the first portion extends between the first end and the first location, wherein the second portion extends between the first location and the second end, wherein the second portion includes a wireway, wherein the first plurality of solar cells is positioned within the first portion, wherein the second plurality of solar cells is positioned within the second portion.

In some embodiments, the second photovoltaic module at least partially overlaps the first photovoltaic module.

In some embodiments, the backsheet comprises a polymer material.

In some embodiments, the backsheet comprises at least one of a polyolefin elastomer (POE), a dielectric material, a thermoplastic polyolefin (TPO), or a continuous fiber tape (CFT).

In some embodiments, the frontsheet comprises: a polymer layer, and a glass layer, wherein the glass layer is juxtaposed with the encapsulant layer.

In some embodiments, the polymer layer comprises at least one of an ethylene tetrafluoroethylene (ETFE) or a polyolefin elastomer (POE).

In some embodiments, the first portion extends along a first plane, the second portion extends along a second plane, wherein the first plane is offset from the second plane.

In some embodiments, the first plurality of solar cells includes at least a first string, the second plurality of solar cells includes at least a second string, wherein the first string extends in a first direction, wherein the second string extends in a second direction, wherein the first direction is different than the second direction.

In some embodiments, the first direction is perpendicular to the second direction.

In some embodiments, the system further comprises a junction box, wherein the junction box is in electrical connection with the first photovoltaic module and the second photovoltaic module.

In some embodiments, the present invention provides a system, comprising: a plurality of photovoltaic modules installed on a roof deck, wherein the plurality of photovoltaic modules includes at least a first photovoltaic module and a second photovoltaic module, wherein the first photovoltaic module and the second photovoltaic module are arranged in an array on the roof deck, wherein each of the plurality of photovoltaic modules comprises: a first end, a second end opposite the first end, and a first location between the first end and the second end; a first plurality of solar cells; a second plurality of solar cells, wherein the first plurality of solar cells in in electrical connection with the second plurality of solar cells; an encapsulant layer, wherein the encapsulant layer encapsulates the first plurality of solar cells and the second plurality of solar cells; a first frontsheet, wherein the first frontsheet is above an upper surface of the encapsulant layer and an upper surface of the first plurality of solar cells; a second frontsheet, wherein the second frontsheet is above the upper surface of the encapsulant layer and an upper surface of the second plurality of solar cells; a backsheet, wherein the backsheet is below a lower surface of the encapsulant layer; and a first portion and a second portion, wherein the first portion extends between the first end and the first location, wherein the second portion extends between the first location and the second end, wherein the second portion includes a wireway, wherein the first plurality of solar cells is positioned within the first portion, wherein the second plurality of solar cells is positioned within the second portion.

In some embodiments, the first frontsheet layer comprises a first glass layer, and the second frontsheet layer comprises a second glass layer.

BRIEF DESCRIPTION OF THE DRAWINGS

This section refers to the drawings that form a part of this disclosure, and which illustrate some of the embodiments of structure, materials, and/or methods of the present invention described herein.

DETAILED DESCRIPTION

Figure 1:
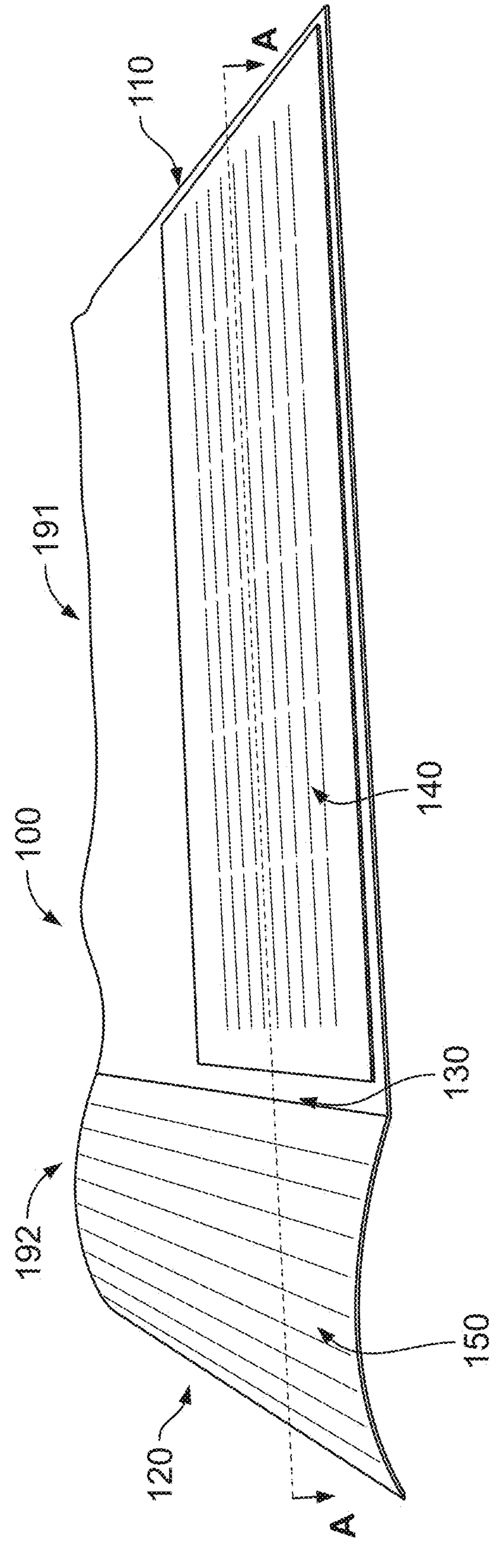
FIG. 1 is a schematic top isometric view of a photovoltaic module, according to some embodiments of the invention.

In addition to the benefits and improvements that the Specification discloses, other objects and advantages that the Specification provides will become apparent from the following description taken in conjunction with the accompanying figures. Although the description discloses and describes detailed embodiments of the present disclosure, the disclosed embodiments are merely illustrative of the disclosure that may be embodied in various forms. In addition, each of the examples given regarding the various embodiments of the disclosure are intended to be illustrative, and not restrictive.

As used herein, a "steep slope" roof or roof deck is a roof or roof deck having a pitch of Y/X, where Y and X are in a ratio of 4:12 to 20:12, where Y corresponds to the "rise" of the roof or roof deck, and where X corresponds to the "run" of the roof or roof deck.

As used herein, a "sloped" roof or roof deck includes a roof or roof deck with a pitch that is less than that of a steep slope roof or roof deck, but which is not a flat roof or roof deck.

In some embodiments, the present invention provides a roofing system including a least one photovoltaic module installed on a roof deck. In some embodiments, the roof deck is a sloped roof deck. In some embodiments, the roof deck is a steep slope roof deck.

In some embodiments, the least one photovoltaic module includes one photovoltaic module. In some embodiments, the least one photovoltaic module includes a plurality of photovoltaic modules. In some embodiments, the plurality of photovoltaic modules includes at least two photovoltaic modules—e.g., a first photovoltaic module, and a second photovoltaic module. In some embodiments, the plurality of photovoltaic modules includes more than two photovoltaic modules. In some embodiments, the photovoltaic modules are arranged in an array on the roof deck. In some embodiments, the second photovoltaic module at least partially overlaps the first photovoltaic module on the roof deck.

In some embodiments, one or more of the photovoltaic modules includes a structure, composition, component, and/or function similar to those of one or more embodiments of the photovoltaic modules and shingles disclosed, shown, and/or described in any or all of: U.S. application Ser. No. 17/831,307, filed Jun. 2, 2022, titled "Roofing Module System," and published under U.S. Patent Application Publication No. 2022-0393637 on Dec. 8, 2022; U.S. application Ser. No. 18/169,718, filed Feb. 15, 2023, titled "Roofing Module System," and published under U.S. Patent Application Publication No. 2023-0203815 on Jun. 29, 2023; PCT International Patent Publication No. WO 2022/051593, Application No. PCT/US2021/049017, published Mar. 10, 2022, titled "Building Integrated Photovoltaic System," owned by GAF Energy LLC; and/or U.S. Pat. No. 11,251,744 to Bunea et al., issued Feb. 15, 2022, titled "Photovoltaic Shingles and Methods of Installing Same"; U.S. Pat. No. 11,404,997 to Bunea et al., issued Aug. 2, 2022, entitled "Photovoltaic Shingles and Methods of Installing Same," owned by GAF Energy LLC; and/or U.S. Pat. No. 12,013,153 to Clemente et al., issued Jun. 18, 2024, entitled "Building Integrated Photovoltaic System," owned by GAF Energy LLC; and U.S. Pat. No. 12,009,782 to West et al., issued Jun. 11, 2024, entitled "Photovoltaic Systems with Wireways," and owned by GAF Energy, LLC, the contents of each of which are incorporated by reference herein in their entirety.

In some embodiments, the roofing system includes at least one non-photovoltaic module installed on the roof deck. In some embodiments, the least one non-photovoltaic module includes one non-photovoltaic module. In some embodiments, the at least one non-photovoltaic module includes a plurality of non-photovoltaic modules. In some embodiments, the one or more non-photovoltaic modules are installed proximate the one or more photovoltaic modules on the roof deck.

In some embodiments, the non-photovoltaic module is a roofing shingle. In some embodiments, the non-photovoltaic module is a cuttable roofing module. In some embodiments, the non-photovoltaic module is a nailable roofing module. In some embodiments, the non-photovoltaic module includes a structure, composition, component, and/or function similar to those of one or more embodiments of a non-photovoltaic module and/or another roofing material disclosed, shown, and/or described in either or both of U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023; and/or U.S. application Ser. No. 18/352,894, filed Jul. 14, 2023, titled "Solar Roofing System with Fiber Composite Roofing Shingles," and the disclosures of each of which are incorporated by reference herein in their entireties, with certain different and/or additional features as described herein.

In some embodiments, the roofing system includes an underlayment between the roof deck and the one or more non-photovoltaic modules and/or one or more photovoltaic modules. In some embodiments, the roofing system omits an underlayment. In some embodiments, the roofing system includes one or more other components other than one or more non-photovoltaic modules, one or more photovoltaic modules, and/or an underlayment.

In some embodiments, one or more of the photovoltaic modules includes a first end, a second end opposite the first end, and a first location between the first end and the second end. In some embodiments, one or more of the photovoltaic modules includes a first plurality of solar cells. In some embodiments, one or more of the photovoltaic modules includes a second plurality of solar cells. In some embodiments, the first plurality of solar cells in in electrical connection with the second plurality of solar cells. In some embodiments, the first plurality of solar cells includes one solar cell. In some embodiments, the first plurality of solar cells includes two solar cells. In some embodiments, the first plurality of solar cells includes three solar cells. In some embodiments, the first plurality of solar cells includes four solar cells. In some embodiments, the first plurality of solar cells includes five solar cells. In some embodiments, the first plurality of solar cells includes six solar cells. In some embodiments, the first plurality of solar cells includes seven solar cells. In some embodiments, the first plurality of solar cells includes eight solar cells. In some embodiments, the first plurality of solar cells includes nine solar cells. In some embodiments, the first plurality of solar cells includes more than nine solar cells. In some embodiments, the second plurality of solar cells includes one solar cell. In some embodiments, the second plurality of solar cells includes two solar cells. In some embodiments, the second plurality of solar cells includes three solar cells. In some embodiments, the second plurality of solar cells includes more than three solar cells.

In some embodiments, the first plurality of solar cells extends in a first direction, and the second plurality of solar cells extends in a second direction. In some embodiments, the first direction is the same as the second direction. In some embodiments, the first direction is different than the second direction. In some embodiments, the first direction is perpendicular to the second direction.

In some embodiments, one or more of the photovoltaic modules includes an encapsulant layer. In some embodiments, the encapsulant layer encapsulates both the first plurality of solar cells and the second plurality of solar cells. In some embodiments, a first encapsulant layer encapsulates the first plurality of solar cells. In some embodiments, a second encapsulant layer encapsulates the second plurality of solar cells. In some embodiments, the first plurality of solar cells are not encapsulated. In some embodiments, the second plurality of solar cells are not encapsulated. In some embodiments, the encapsulant layer encapsulates a top surface and a bottom surface of the solar cells of the first plurality of solar cells and/or the solar cells of the second plurality of solar cells. In some embodiments, the encapsulant layer includes a polyolefin elastomer (POE).

In some embodiments, one or more of the photovoltaic modules includes a frontsheet. In some embodiments, the frontsheet is above an upper surface of the encapsulant layer. In some embodiments, the frontsheet is a top or uppermost layer of the photovoltaic module. In some embodiments, the frontsheet includes a polymer layer. In some embodiments, the frontsheet includes a glass layer. In some embodiments, the frontsheet includes one or more polymer layers and/or one or more glass layers. In some embodiments, one of the glass layers is juxtaposed with the encapsulant layer. In some embodiments, one of the polymer layers is the top or uppermost layer of the photovoltaic module. In some embodiments, the polymer layer includes one or more of an ethylene tetrafluoroethylene (ETFE) material and/or layer, or a polyolefin elastomer (POE) material and/or layer, and/or a combination thereof. In some embodiments, the frontsheet includes (from top or uppermost layer to bottom or lowermost layer, with the bottom layer being juxtaposed with the encapsulant layer, and the top layer being opposite the bottom layer) an ethylene tetrafluoroethylene (ETFE) layer, a polyolefin elastomer (POE) layer, and a glass layer. In some embodiments, the materials and/or layers are in a different order.

In some embodiments, one or more of the photovoltaic modules includes a backsheet. In some embodiments, the backsheet is below a lower surface of the encapsulant layer. In some embodiments, the backsheet includes a polymer material. In some embodiments, the backsheet includes one or more of a dielectric material and/or layer, a thermoplastic polyolefin (TPO) material and/or layer, and/or a continuous fiber tape (CFT) material and/or layer, and/or combinations thereof. In some embodiments, the backsheet includes (from top or uppermost layer to bottom or lowermost layer, with the top layer being juxtaposed with the encapsulant layer, and the bottom layer being opposite the top layer) a dielectric layer, a POE layer, a TPO layer, and a CFT layer. In some embodiments, the materials and/or layers are in a different order.

In some embodiments, one or more of the photovoltaic modules includes a first portion and a second portion, wherein the first portion extends between the first end and the first location, and wherein the second portion extends between the first location and the second end. In some embodiments, the second portion includes a wireway. In some embodiments, the first plurality of solar cells is positioned within the first portion. In some embodiments, the second plurality of solar cells is positioned within the second portion. In some embodiments, the first portion extends along a first plane. In some embodiments, the second portion extends along a second plane. In some embodiments, the first plane is offset from the second plane.

In some embodiments, the second plane is offset vertically relative to the first plane. In some embodiments, the second plane is offset vertically relative to the first plane such that when the photovoltaic module is positioned on a horizontal surface, at least a portion of the second plane is at a different vertical height than at least a portion of the first plane. In some embodiments, the second plane is offset vertically relative to the first plane such that when the photovoltaic module is positioned on a roof deck, at least a portion of the second plane is at a different vertical height than at least a portion of the first plane.

In some embodiments, the first portion is substantially flat. In some embodiments, the second portion is substantially flat. In some embodiments, the second portion is offset from the first portion. In some embodiments, the second portion is stepped relative to the first portion. In some embodiments, the second portion is curved. In some embodiments, there is a stepped, curved, and/or offset transition portion between the first portion and the second portion.

In some embodiments, the first plurality of solar cells includes at least a first string. In some embodiments, the second plurality of solar cells includes at least a second string. In some embodiments, first string extends in a first direction. In some embodiments, the second string extends in a second direction. In some embodiments, the first direction is the same as the second direction. In some embodiments, the first direction is different than the second direction. In some embodiments, the first and second directions are perpendicular to one another. In some embodiments, the string connects the solar cells of the first plurality of solar cells and the solar cells of the second plurality of solar cells.

In some embodiments, the system further includes a junction box. In some embodiments, the junction box is in electrical connection with the first plurality of solar cells. In some embodiments, the junction box is in electrical connection with the second plurality of solar cells. In some embodiments, the junction box is in electrical connection with the first plurality of solar cells and the second plurality of solar cells.

In some embodiments, one or more of the photovoltaic modules includes a first frontsheet layer. In some embodiments, the first frontsheet layer is above an upper surface of the encapsulant layer and an upper surface of the first plurality of solar cells. In some embodiments, one or more of the photovoltaic modules includes a second frontsheet layer. In some embodiments, the second frontsheet layer is above the upper surface of the encapsulant layer and an upper surface of the second plurality of solar cells.

In some embodiments, one or more of the photovoltaic modules omits a frontsheet over the second plurality of solar cells. In some embodiments, one or more of the photovoltaic modules omits one or more layers of the frontsheet over the second plurality of solar cells. In some embodiments, one or more of the photovoltaic modules omits a glass layer of the frontsheet over the second plurality of solar cells.

In some embodiments, the second portion is at one edge or end of the photovoltaic module. In some embodiments, a third portion is at an opposite end of edge of the photovoltaic module. In some embodiments, the third portion is in accordance with the description and illustration of the second portion. In some embodiments, the third portion includes a third plurality of solar cells. In some embodiments, the third plurality of solar cells is in accordance with the description and illustration of the second plurality of solar cells. In some embodiments, the third portion omits solar cells.

In some embodiments, one or more of the photovoltaic modules includes one or more electrical components. In some embodiments, one or more of the photovoltaic modules includes a junction box. In some embodiments, the one or more electrical components includes power electronics. In some embodiments, the power electronics includes a power optimizer, a bypass diode, system monitoring electronic components, a rapid shutdown device, an electronic communication component, or combinations thereof. In some embodiments, one or more of the photovoltaic modules includes a powered junction module. In some embodiments, the one or more electrical components are positioned on or form a portion of a top surface or face of the photovoltaic module. In some embodiments, the one or more electrical components are positioned on or form a portion of a bottom surface of face of the photovoltaic module. In some embodiments, the one or more electrical components are positioned on or formed a portion of both a top face and a bottom face of the photovoltaic module. In some embodiments, the one or more electrical components are positioned on or form a portion of the first portion of the photovoltaic module. In some embodiments, the one or more electrical components are positioned on or form a portion of a top face of the second portion of the photovoltaic module. In some embodiments, the one or more electrical components are positioned on or form a portion of a top face of both the first portion and the second portion of the photovoltaic module. In some embodiments, one or more electrical components are positioned on a top surface and/or a bottom surface of the first portion. In some embodiments, one or more electrical components are positioned on a top surface and/or a bottom surface of the second portion.

With reference to the drawings, FIG. 1 is a schematic top isometric view of a photovoltaic module 100, according to some embodiments of the invention. As FIG. 1 shows, in some embodiments, the photovoltaic module 100 includes a first end 110, a second end 120 opposite the first end 110, and a first location 130 between the first end 110 and the second end 120. In some embodiments, the photovoltaic module 100 includes a first portion 191. In some embodiments, the first portion extends from the first end 110 to the first location 190. In some embodiments, the photovoltaic module 100 includes a second portion 192. In some embodiments, the second portion extends from the first location 190 to the second end 120.

In some embodiments, as FIG. 1 illustrates, the photovoltaic module 100 includes a first plurality of solar cells 140, and a second plurality of solar cells 150. In some embodiments, the first plurality of solar cells 140 in in electrical connection or communication with the second plurality of solar cells 150. In some embodiments, the first plurality of solar cells 140 extends in a first direction, and the second plurality of solar cells 150 extends in a second direction. In some embodiments, the second direction is perpendicular to the first direction. In some embodiments, the second direction is substantially perpendicular to the first direction. In some embodiments, the first plurality of solar cells 140 and the second plurality of solar cells 150 are perpendicular to one another. In some embodiments, the first plurality of solar cells 140 is within the first portion 191. In some embodiments, the second plurality of solar cells 150 is within the In some embodiments, as FIG. 1 shows, the second portion 192 has a curved profile or cross-section.

FIGS. 2 through 5 are schematic cross-sectional views of the photovoltaic module 100, taken along line A-A in FIG. 1, according to some embodiments of the invention. As FIGS. 2 through 5 illustrate, in some embodiments, the photovoltaic module 100 includes an encapsulant layer 160. In some embodiments, the encapsulant layer 160 encapsulates the first plurality of solar cells 140 and the second plurality of solar cells 150. In some embodiments, the encapsulant layer 160 includes two layers. In some embodiments, the encapsulant layer 160 includes an upper layer and a lower layer.

Figure 2:
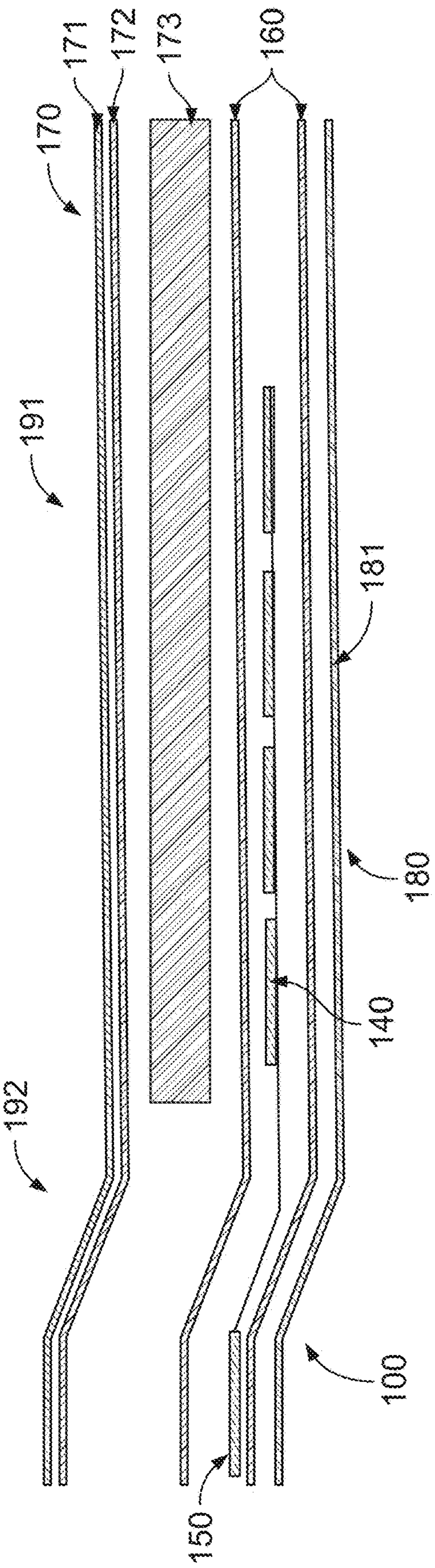
FIGS. 2 through 5 are schematic cross-sectional views of the photovoltaic module of FIG. 1, taken along line A-A, according to some embodiments of the invention.
Figure 3:
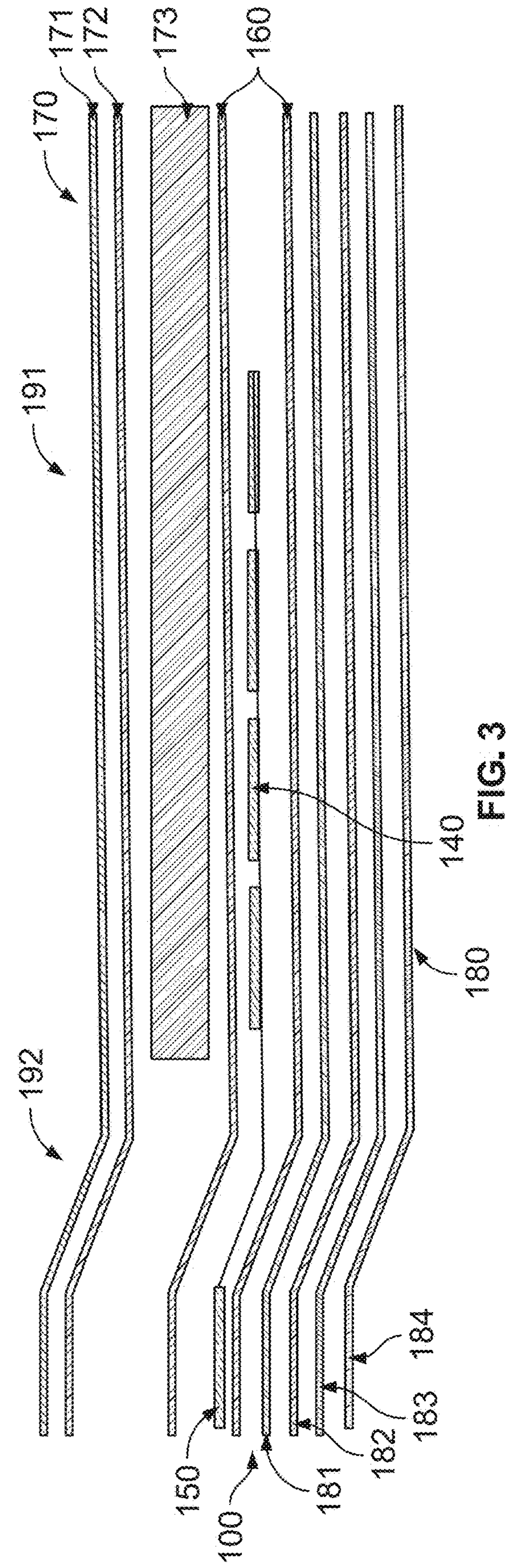
Figure 4:
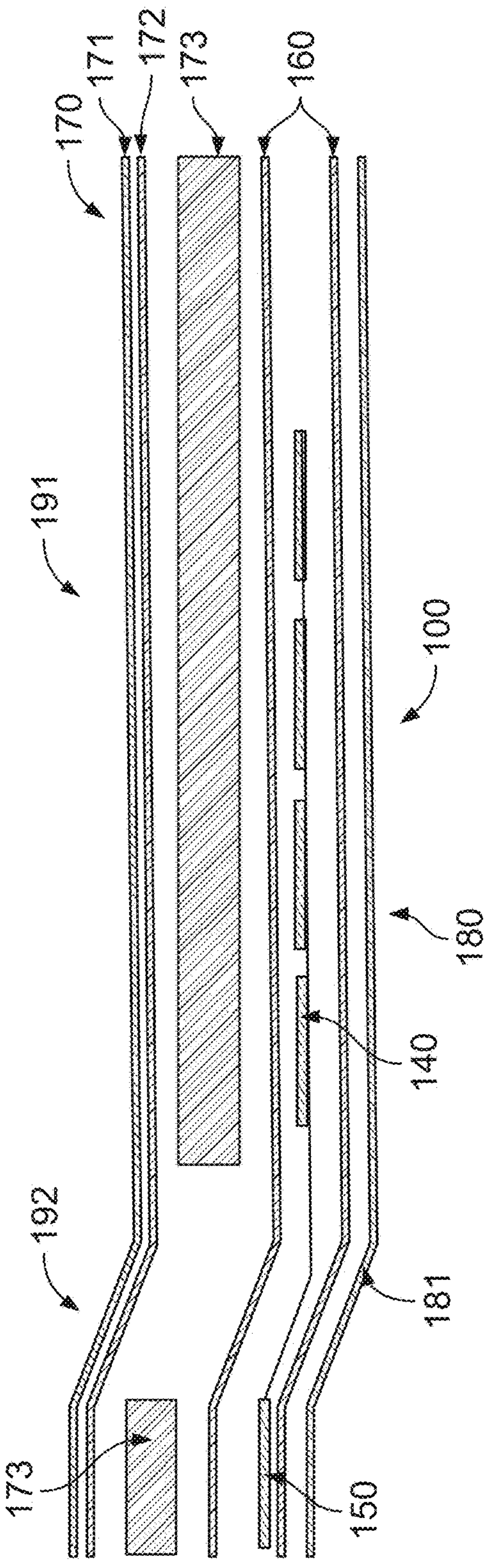
Figure 5:
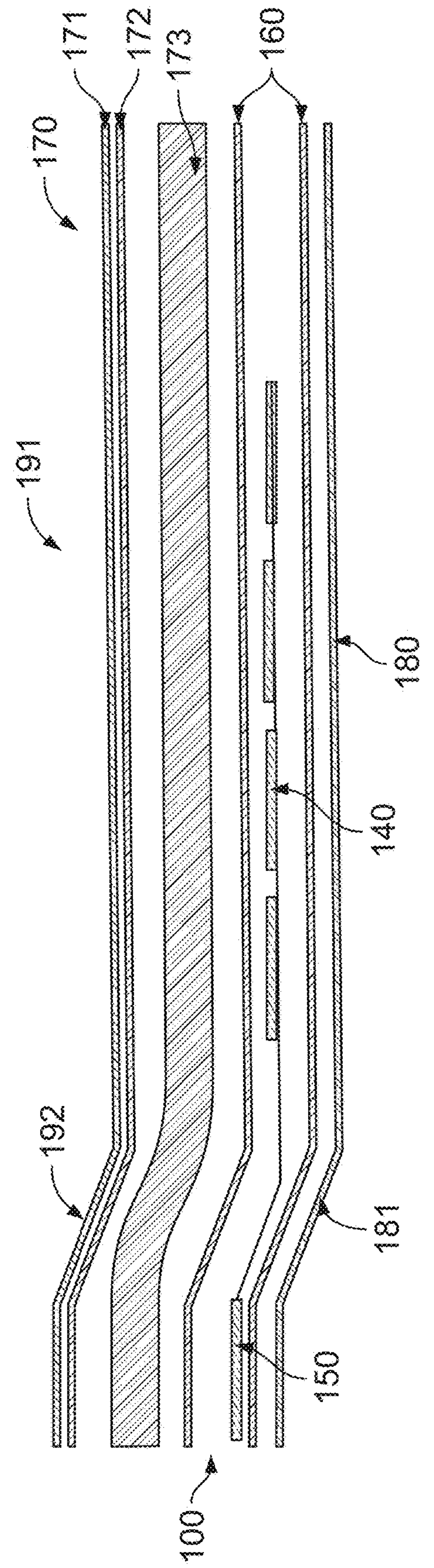

As FIGS. 2 through 5 illustrate, in some embodiments, the photovoltaic module 100 includes a frontsheet 170 above an upper surface of the encapsulant layer 160. In some embodiments, the frontsheet 170 includes a first layer 171, a second layer 172, and a third layer 173. In some embodiments, the first layer 171 includes a polymer. In some embodiments, the first layer 171 includes ETFE. In some embodiments, the second layer 172 is an adhesive layer. In some embodiments, second layer includes POE. In some embodiments, the third layer 173 includes glass. In some embodiments, as FIG. 5 illustrates, the third layer 173 covers both of the first plurality of solar cells 140 and the second plurality of solar cells 150. In some embodiments, as FIG. 4 shows, separate third layers 173 cover each of the first plurality of solar cells 140 and the second plurality of solar cells 150. In some embodiments, as FIGS. 2 and 3 illustrate, the third layer 173 does not cover the second plurality of solar cells 150.

As FIGS. 2 through 5 illustrate, in some embodiments, the photovoltaic module 100 includes a backsheet 180. In some embodiments, the backsheet 180 is below a lower surface of the encapsulant layer 160. In some embodiments, as FIGS. 2 through 5 show, the backsheet 180 includes a first layer 181. In some embodiments, as FIG. 3 illustrates, the backsheet 180 includes a first layer 181, a second layer 182, a third layer 183, and a fourth layer 184. In some embodiments, the first layer 181 includes a dielectric material. In some embodiments, the second layer 182 is an adhesive layer. In some embodiments, the second layer 182 includes POE. In some embodiments, the third layer 183 includes a polymer. In some embodiments, the third layer 183 includes TPO. In some embodiments, the fourth layer 184 includes CFT. In some embodiments, as shown in FIGS. 2, 4 and 5, the backsheet 180 only includes the first layer 181. In some embodiments, the backsheet 180 is a metal layer.

In some embodiments, as FIGS. 1 through 5 illustrate, the photovoltaic module 100 includes the first portion 191 and the second portion 192. In some embodiments, the first portion 191 extends between the first end 110 and the first location 130. In some embodiments, the second portion 192 extends between the first location 130 and the second end 120. As FIGS. 1 through 5 show, in some embodiments, the second portion 192 includes a wireway. In some embodiments, the wireway is integrated with the photovoltaic module 100 by virtue of the first location 190 and the second portion 192 being integral with one another. In some embodiments, the second portion 192 is a wireway cover. In some embodiments, the first plurality of solar cells 140 is positioned within the first portion 191. In some embodiments, the second plurality of solar cells 150 is positioned within the second portion 192. In some embodiments, the second portion 192 as a wireway cover may include a certain structure, composition, component, and/or function similar to those of one or more embodiments of the wireway covers disclosed, shown, and/or described in any or all of PCT International Patent Publication No. WO 2022/051593, Application No. PCT/US2021/049017, published Mar. 10, 2022, titled “Building Integrated Photovoltaic System,” owned by GAF Energy LLC; and/or U.S. Pat. No. 11,251,744 to Bunea et al., issued Feb. 15, 2022, titled “Photovoltaic Shingles and Methods of Installing Same”; U.S. Pat. No. 11,404,997 to Bunea et al., issued Aug. 2, 2022, entitled “Photovoltaic Shingles and Methods of Installing Same,” owned by GAF Energy LLC; U.S. Pat. No. 12,013,153 to Clemente et al., issued Jun. 18, 2024 entitled “Building Integrated Photovoltaic System,” owned by GAF Energy LLC; and/or U.S. Pat. No. 12,009,782 to West et al., issued Jun. 11, 2024, entitled “Photovoltaic Systems with Wireways,” and owned by GAF Energy, LLC, the contents of each of which are incorporated by reference herein in their entirety.

In some embodiments, as FIGS. 1 through 5 show, the first layer 171 and the second layer 172 of the frontsheet 170 extend between and are positioned within the first portion 191 and the second portion 192 of the photovoltaic module 100. In some embodiments, as shown FIG. 4, the third layer 173 includes two separate portions, and there is a gap between the separate portions of the third layer 173. In some embodiments, there is a gap between the portion of the third layer 173 extending along and positioned within the first portion 191, which covers the first plurality of solar cells 140, and the separate portion of the third layer 173 extending along and positioned within the second portion 192, which covers the second plurality of solar cells 150 and the second portion 192. In some embodiments, as shown in FIG. 5, the third layer 173 extends between and is positioned within the first portion 191 and the second portion 192 of the photovoltaic module 100. In some embodiments, as FIGS. 2 and 3 show, the third layer 173 of the frontsheet 170 extends along and is positioned within only the first portion 191 of the photovoltaic module 100.

In some embodiments, as FIGS. 1 through 5 show, the encapsulant layer 160 extends between and is positioned within the first portion 191 and the second portion 192 of the photovoltaic module 100, such that the encapsulant layer 160 encapsulates both the first plurality of solar cells 140 and the second plurality of solar cells 150. In some embodiments, as FIGS. 1 through 5 show, the backsheet 180 extends between and is positioned within both the first portion 191 and the second portion 192.

Figure 6:
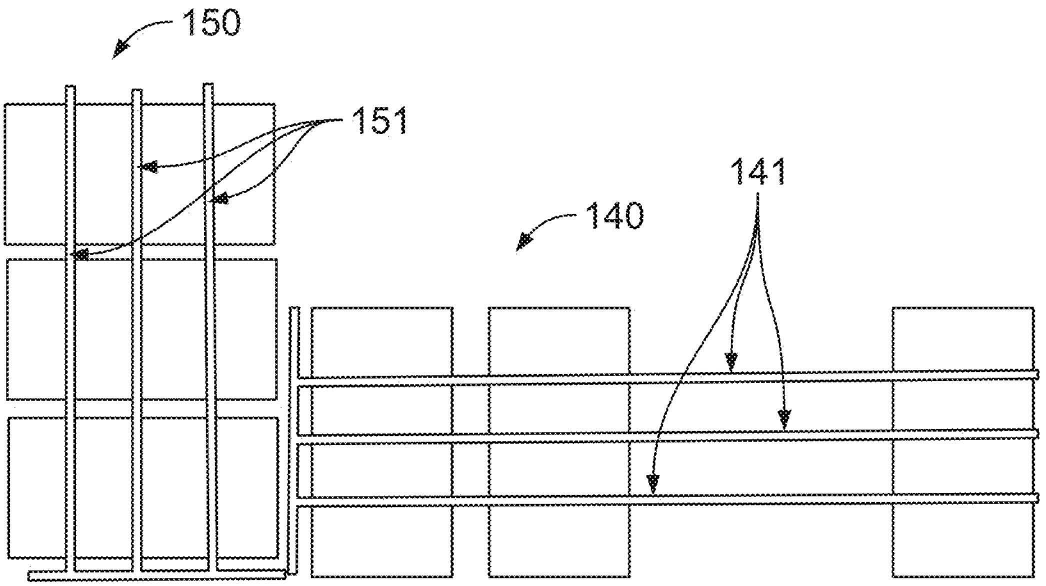
FIG. 6 is a schematic top view of a first plurality of solar cells and a second plurality of solar cells of the photovoltaic module of FIG. 1, according to some embodiments of the invention.

FIG. 6 is a schematic top view of the first plurality of solar cells 140 and the second plurality of solar cells of the photovoltaic module 100 of FIG. 1, according to some embodiments of the invention. In some embodiments, the first plurality of solar cells 140 extends in the first direction, and the second plurality of solar cells 150 extends in the second direction. In some embodiments, the second direction is perpendicular to the first direction. As FIG. 6 shows, in some embodiments, solar cells of the first plurality of solar cells 140 are electrically connected to or in electrical communication with one another by one or more first strings 141, while solar cells of the second plurality of solar cells 150 are electrically connected to or in electrical communication with one another by one or more second strings 151. In some embodiments, the one or more first strings 141 extend in a first direction, while the one or more second strings 151 extend in a second direction, where the second direction is different than the first direction. In some embodiments, the first and second directions are perpendicular to one another.

Figure 7:
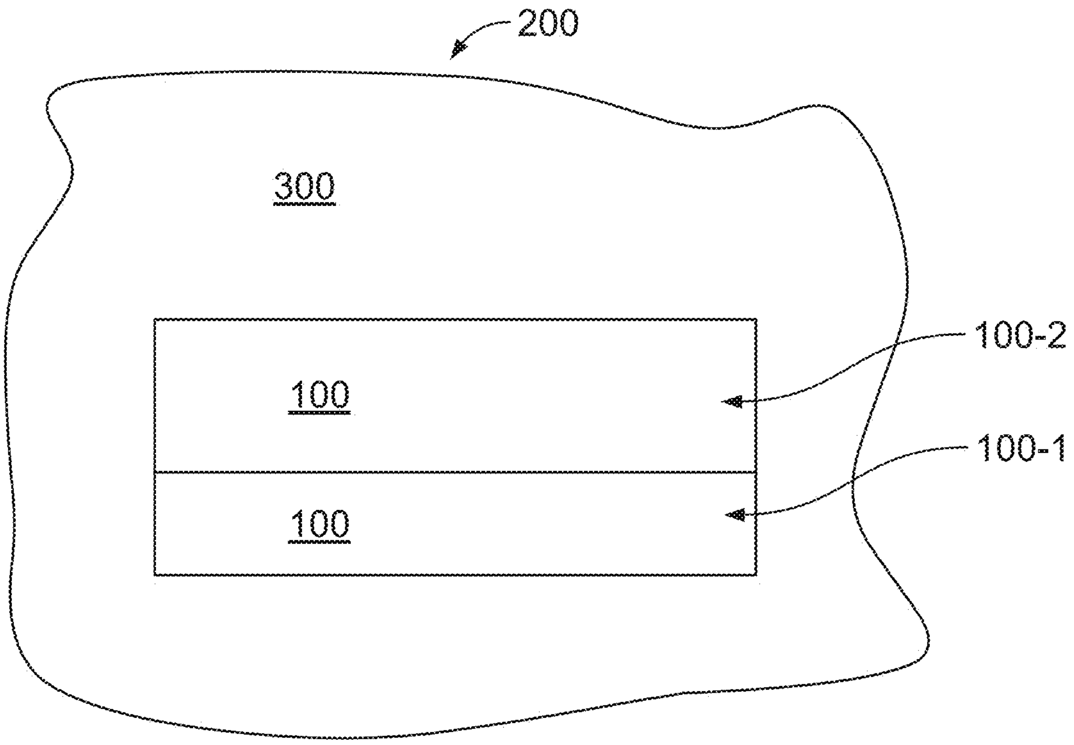
FIG. 7 is a schematic top view of a roofing system, including a plurality of photovoltaic modules installed on a roof deck, in accordance with some embodiments of the invention.

FIG. 7 is a simplified schematic top view of a roofing system 200, including a plurality of the photovoltaic modules 100 installed on a roof deck 300, in accordance with some embodiments of the invention. As FIG. 7 shows, in some embodiments, photovoltaic module 100-1 is at least partially overlapped by photovoltaic module 100-2, and the photovoltaic modules 100 are arranged in an array on the roof deck 300.

Figure 8:
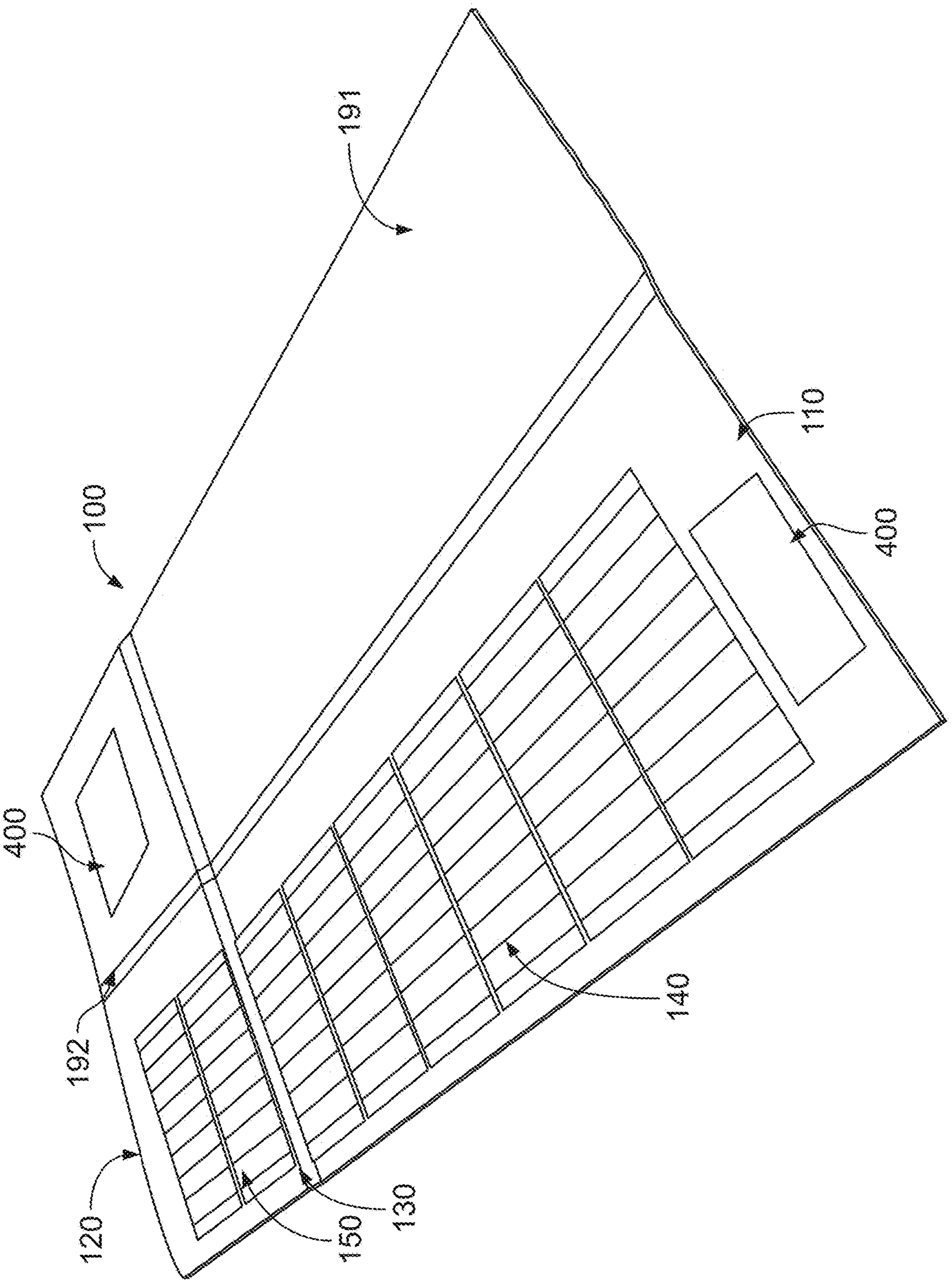
FIG. 8 is a schematic top isometric view of a photovoltaic module, according to some embodiments of the invention.

FIG. 8 is a schematic top isometric view of the photovoltaic module 100, according to some embodiments of the invention. As FIG. 8 shows, in some embodiments, the first plurality of solar cells 140 and the second plurality of solar cells 150 extend in the same direction. In some embodiments, as FIG. 8 illustrates, one or more strings electrically connect both the solar cells of the first plurality of solar cells 140 and the solar cells of the second plurality of solar cells 150.

In some embodiments, as FIG. 8 illustrates, the photovoltaic module 100 includes one or more electrical components 400, on either or both of the first portion 191 and/or the second portion 192. In some embodiments, as FIG. 8 shows, one electrical component 400 is on a top or uppermost surface of the first portion 191, and one electrical component 400 is on a bottom or lowermost surface of the second portion 192. In some embodiments, as FIG. 8 shows, the second portion 192 has a flat profile or cross-section. In some embodiments, one electrical component 400 is on a bottom or lowermost surface of the first portion 191. In some embodiments, one electrical component 400 is on a top or uppermost surface of the second portion 192.

Figure 9:
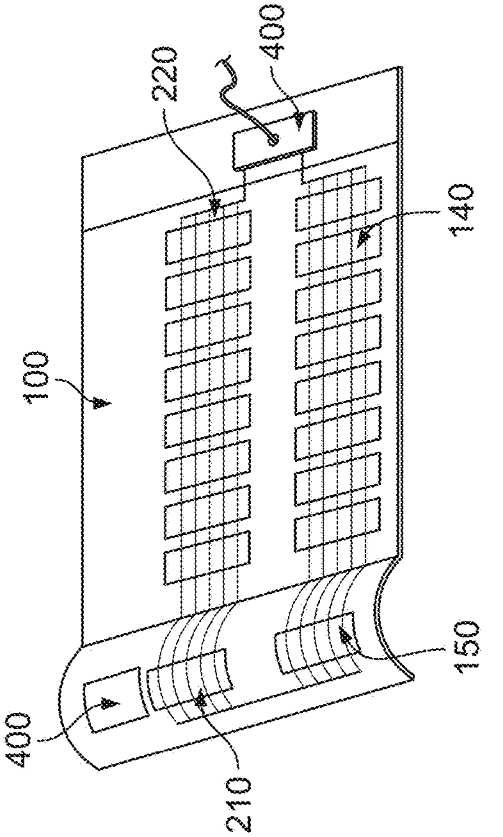
FIG. 9 is a schematic top isometric view of a photovoltaic module, according to some embodiments of the invention.

FIG. 9 is a schematic top isometric view of the photovoltaic module 100, according to some embodiments of the invention. As FIG. 9 illustrates, in some embodiments, the photovoltaic module 100 includes the first plurality of solar cells 140, the second plurality of solar cells 150, a third plurality of solar cells 210, and a fourth plurality of solar cells 220. In some embodiments, the third plurality of solar cells 210 is positioned within the second portion 192 of the photovoltaic module 100, and the fourth plurality of solar cells 220 is positioned within the first portion 191 of the photovoltaic module 100. In some embodiments, one or more strings electrically connect the solar cells of the first plurality of solar cells 140 and the solar cells of the second plurality of solar cells 150, while one or more strings electrically connect the solar cells of the third plurality of solar cells 210 and the solar cells of the fourth plurality of solar cells 220. As FIG. 9 shows, in some embodiments, the strings are electrically connected to one another, and are electrically connected to the electrical components 400. In some embodiments, as FIG. 9 shows, one electrical component 400 is on a top or uppermost surface of the first portion 191, and one electrical component 400 is on a bottom or lowermost surface of the second portion 192. In some embodiments, as FIG. 9 shows, the second portion 192 has a curved profile or cross-section. In some embodiments, one electrical component 400 is on a bottom or lowermost surface of the first portion 191. In some embodiments, one electrical component 400 is on a top or uppermost surface of the second portion 192.

Figure 10:
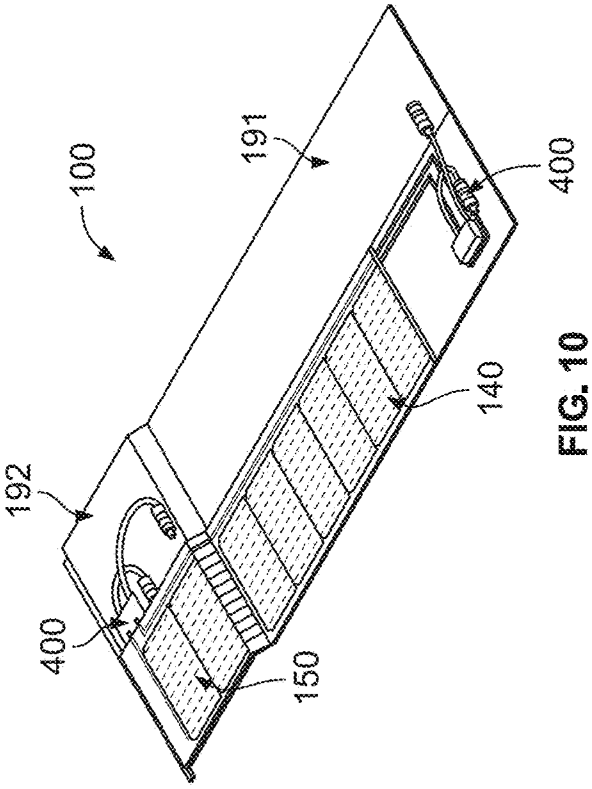
FIG. 10 is a schematic top isometric view of a photovoltaic module, according to some embodiments of the invention.

FIG. 10 is a schematic top isometric view of the photovoltaic module 100, according to some embodiments of the invention. As FIG. 10 illustrates, in some embodiments, one or more strings electrically connect the solar cells of the first plurality of solar cells 140 and the solar cells of the second plurality of solar cells 150. As FIG. 10 shows, in some embodiments, the strings are electrically connected to one another, and to the electrical components 400. In some embodiments, as FIG. 10 shows, one electrical component 400 is on a top or uppermost surface of the first portion 191, and one electrical component 400 is on a bottom or lowermost surface of the second portion 192. In some embodiments, as FIG. 10 shows, the second portion 192 has a flat profile or cross-section.

Figure 11:
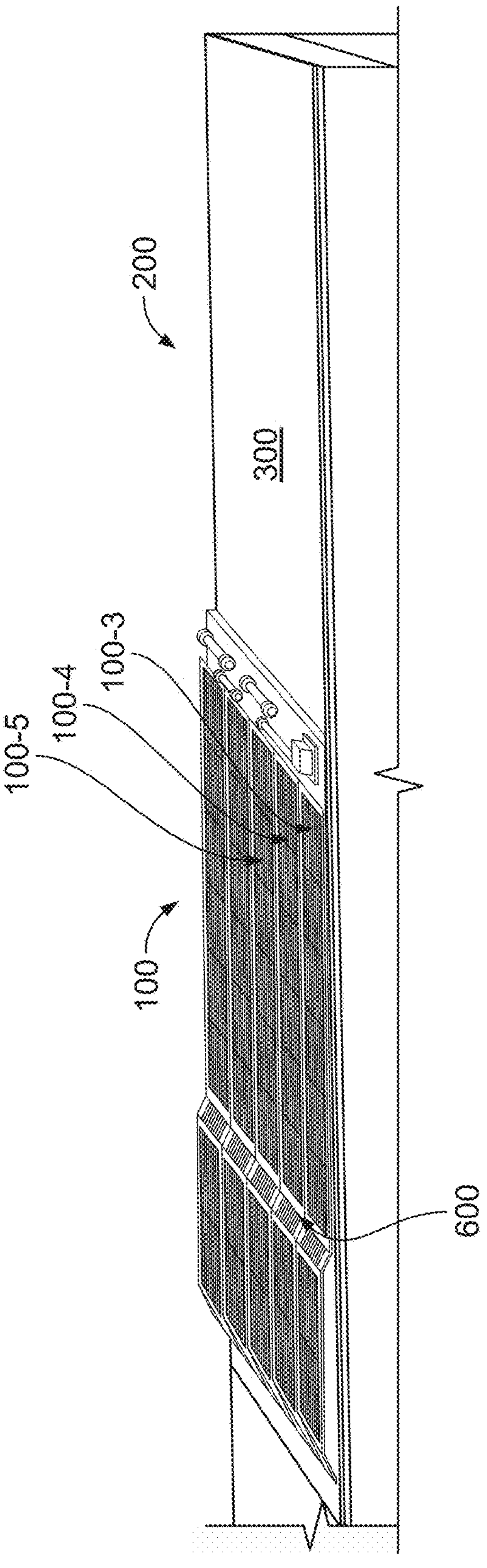
FIG. 11 is an isometric top view of a roofing system, including a plurality of the photovoltaic module of FIG. 10, installed on the roof deck, in accordance with some embodiments of the invention.

FIG. 11 is an isometric top view of the roofing system 200, including a plurality of the photovoltaic modules 100 of FIG. 10, installed on the roof deck 300, in accordance with some embodiments of the invention. As FIG. 11 shows, in some embodiments, photovoltaic module 100-3 is at least partially overlapped by photovoltaic module 100-4, which is at least partially overlapped by photovoltaic module 100-5, and the photovoltaic modules are arranged in an array on the roof deck 300. In some embodiments, an adhesive, foam, and/or other sealing component, compound, or element is disposed in gaps 420 between photovoltaic modules 100.

Figure 12:
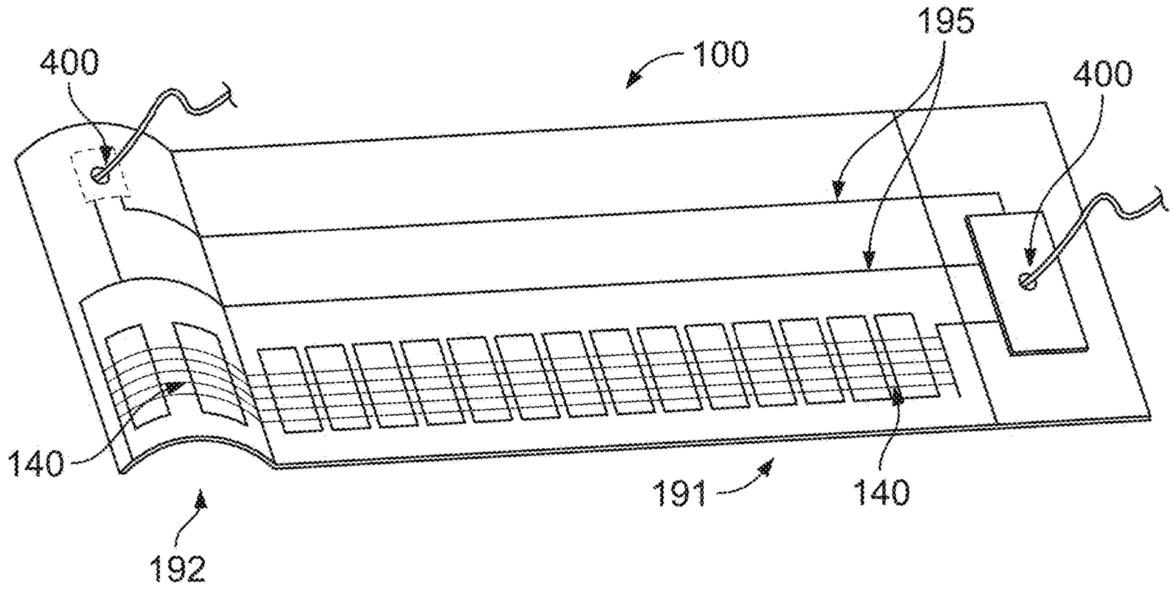
FIG. 12 is a schematic top isometric view of a photovoltaic module, according to some embodiments of the invention.

FIG. 12 is a schematic top isometric view of the photovoltaic module 100, according to some embodiments of the invention. As FIG. 12 illustrates, in some embodiments, the photovoltaic module 100 includes the first plurality of solar cells 140 and the second plurality of solar cells 150. In some embodiments, one or more strings electrically connect the solar cells of the first plurality of solar cells 140 and the solar cells of the second plurality of solar cells 150. As FIG. 12 shows, in some embodiments, the strings are electrically connected to one or more of the electrical components 400. In some embodiments, as FIG. 12 illustrates, one electrical component 400 is on the top or uppermost surface of the first portion 191, and one electrical component 400 is on the bottom or lowermost surface of the second portion 192. In some embodiments, the electrical component 400 on the first portion 191 is at least one of a junction box, a power optimizer, a bypass diode, system monitoring electronic components, a rapid shutdown device, an electronic communication component, or combinations thereof. In some embodiments, the electrical component 400 on the second portion 192 is a junction box. In some embodiments, the photovoltaic module 100 includes one or more bus bars 195 connecting the electrical components 400 to one another. Thus, in some embodiments, the photovoltaic module 100 of FIG. 12 is a jumper module that electrically connects one or more of the photovoltaic module 100 in one column to one or more of another photovoltaic module 100 in another column, when the photovoltaic modules are installed in an array.

Figure 13:
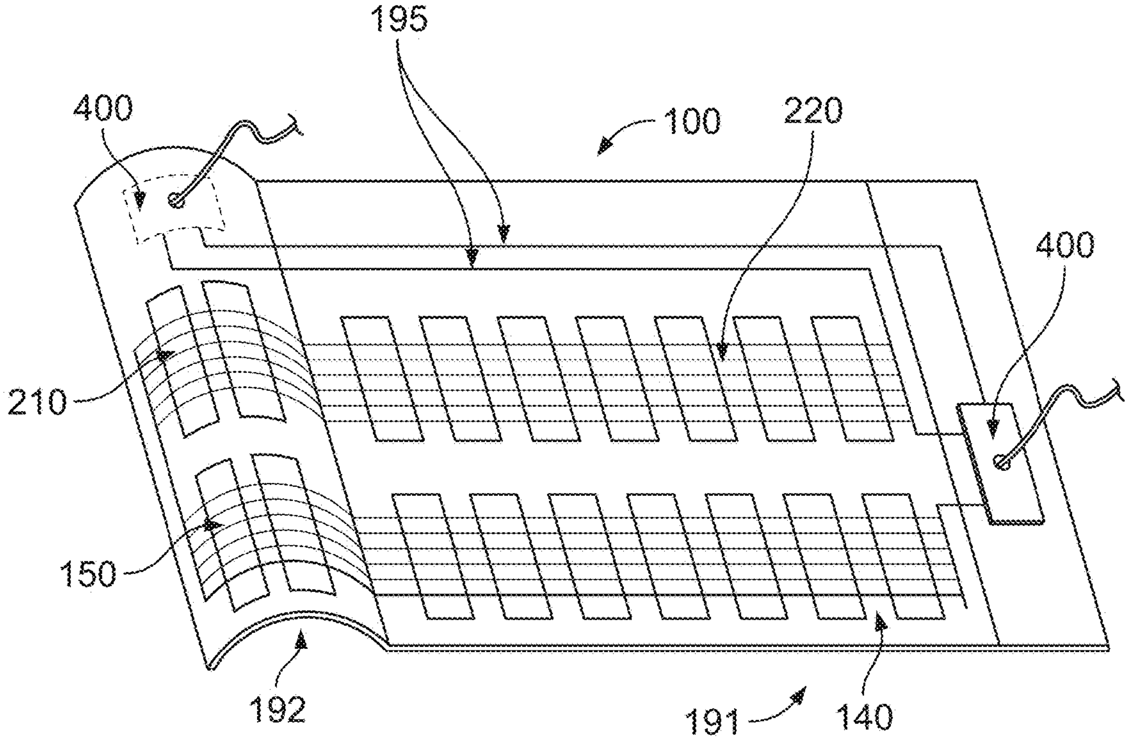
FIG. 13 is a schematic top isometric view of a photovoltaic module, according to some embodiments of the invention.

FIG. 13 is a schematic top isometric view of the photovoltaic module 100, according to some embodiments of the invention. As FIG. 13 illustrates, in some embodiments, the photovoltaic module 100 includes the first plurality of solar cells 140, the second plurality of solar cells 150, the third plurality of solar cells 210, and the fourth plurality of solar cells 220. In some embodiments, one or more strings electrically connect the solar cells of the first plurality of solar cells 140 and the solar cells of the second plurality of solar cells 150, while one or more strings electrically connect the solar cells of the third plurality of solar cells 210 and the solar cells of the fourth plurality of solar cells 220. In some embodiments, as FIG. 13 shows, one electrical component 400 is on a top or uppermost surface of the first portion 191, and one electrical component 400 is on a bottom or lowermost surface of the second portion 192. In some embodiments, the electrical component 400 on the first portion 191 is at least one of a junction box, a power optimizer, a bypass diode, system monitoring electronic components, a rapid shutdown device, an electronic communication component, or combinations thereof. In some embodiments, the electrical component 400 on the second portion 192 is a junction box. In some embodiments, the photovoltaic module 100 includes one or more bus bars 195 connecting the electrical components 400 to one another. Thus, in some embodiments, the photovoltaic module 100 of FIG. 13 is a jumper module that electrically connects one or more of the photovoltaic module 100 in one column to one or more of another photovoltaic module 100 in another column, when the photovoltaic modules are installed in an array. In some embodiments, the jumper module is an uppermost module in a column of an array or subarray of the photovoltaic modules 100.

Figure 14:
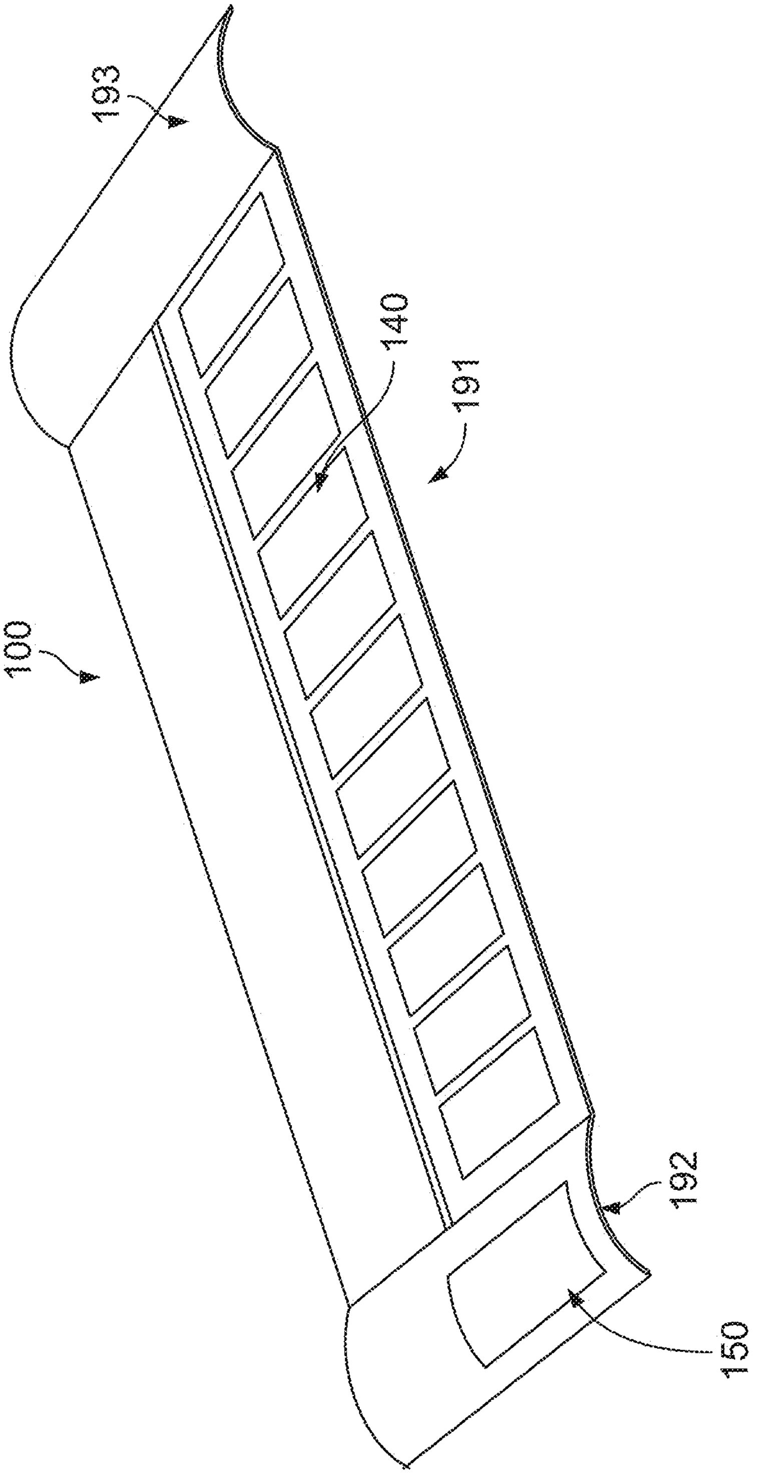
FIG. 14 is a schematic top isometric view of a photovoltaic module, according to some embodiments of the invention.

FIG. 14 is a schematic top isometric view of the photovoltaic module 100, according to some embodiments of the invention. As FIG. 14 illustrates, in some embodiments, the photovoltaic module 100 includes the first plurality of solar cells 140 extending along and positioned within the first portion 191, and the second plurality of solar cells 150 extending along and positioned within the second portion 192. In some embodiments, the photovoltaic module 100 includes a third portion 193. In some embodiments, no solar cells extend along or are positioned within the third portion 193. In some embodiments, the third portion 193 has a similar profile as the first portion 191. In some embodiments, the third portion 193 has a different profile than the first portion 191. In some embodiments, the third portion 193 includes a molded junction box or baseplate. In some embodiments, the third portion 193 supports the first portion 191 of another photovoltaic module 100, such as when multiple photovoltaic modules 100 are installed in a same row on the roof deck.

Figure 15:
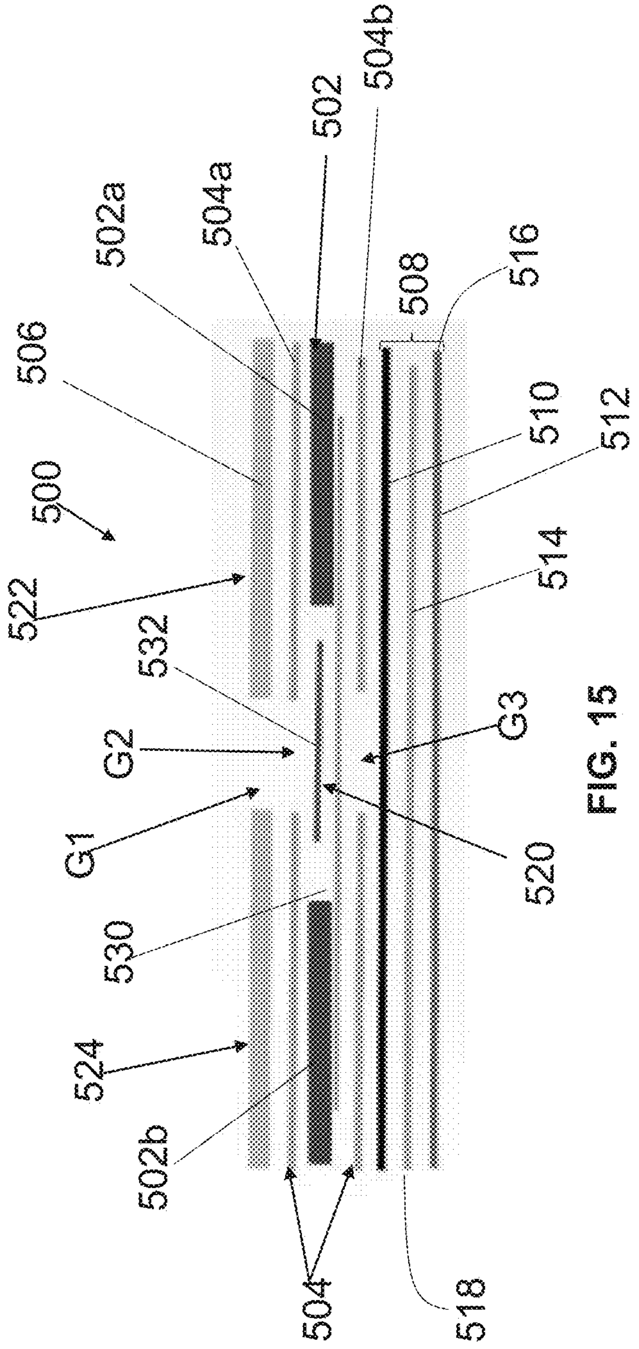
FIGS. 15 through 17 are schematic, cross-sectional views of some embodiments of photovoltaic modules.

Referring to FIG. 15, in some embodiments, a photovoltaic module 500 includes a plurality of solar cells 502. In some embodiments, the plurality of solar cells 502 includes a first plurality of solar cells 502*a* and a second plurality of solar cells 502*b*. In some embodiments, the plurality of solar cells 502 is encapsulated by an encapsulant 504. In some embodiments, the encapsulant 504 includes a first encapsulant layer 504*a* and a second encapsulant layer 504*b*. In some embodiments, the first encapsulant layer 504*a* is above the plurality of solar cells 502. In some embodiments, the second encapsulant layer 504*b* is below the plurality of solar cells 502.

In some embodiments, the photovoltaic module 500 includes a frontsheet 506. In some embodiments, the frontsheet 506 includes a first layer. In some embodiments, the first layer is a glass layer. In some embodiments, the first layer is a polymer layer. In some embodiments, the first layer is the uppermost layer of the photovoltaic module 500. In some embodiments, the frontsheet 506 includes a plurality of layers. In some embodiments, the frontsheet 506 includes a glass layer, a polymer layer above the glass layer, and an adhesive layer between the glass layer and the polymer layer. In some embodiments, the polymer layer is the uppermost layer of the photovoltaic module 500.

In some embodiments, the photovoltaic module 500 includes a backsheet 508. In some embodiments, the backsheet 508 is the lowermost layer of the photovoltaic module 500. In some embodiments, the backsheet 508 includes a first layer 510. In some embodiments, the backsheet 508 only includes the first layer 510. In some embodiments, the backsheet 508 includes a second layer 512. In some embodiments, the second layer 512 is below the first layer 510. In some embodiments, the backsheet 508 includes an adhesive layer 514. In some embodiments, the adhesive layer 514 is between the first layer 510 and the second layer 512. In some embodiments, the first layer 510 is composed of a polymer. In some embodiments, the first layer 510 is composed of polyethylene terephthalate (PET). In some embodiments, the first layer 510 is composed of thermoplastic polyolefin (TPO). In some embodiments, the second layer 512 is composed of a polymer. In some embodiments, the second layer 512 is composed of TPO. In some embodiments, the second layer 512 is composed of PET. In some embodiments, the adhesive layer 514 is composed of polyolefin elastomer (POE).

In some embodiments, the photovoltaic module 500 includes a first end 516, a second end 518 opposite the first end 516, and a hinge region 520 between the first end 516 and the second end 518. In some embodiments, the photovoltaic module 500 includes a first portion 522 extending from the first end 516 to the hinge region 520. In some embodiments, the first plurality of solar cells 502*a* is in the first portion 522. In some embodiments, the photovoltaic module 500 includes a second portion 524 extending from the second end 518 to the hinge region 520. In some embodiments, the second plurality of solar cells 502*b* is in the second portion 524. In some embodiments, the second portion 524 includes a wireway. In some embodiments, the first portion 522 extends along a first plane. In some embodiments, the second portion 524 extends along a second plane. In some embodiments, the first plane is offset from the second plane as described above.

In some embodiments, at the hinge region 520, the photovoltaic module 500 is flexible, bendable, or moveable. In some embodiments, a thickness of photovoltaic module at the hinge region 520 is less than a thickness of the photovoltaic module in the first portion 522 and/or the second portion 524.

In some embodiments, a frontsheet 506 includes a first gap G1. In some embodiments, the first gap G1 is located at or proximate to the hinge region 520. In some embodiments, the first gap G1 extends from an upper surface of the frontsheet 506 to an opposite, lower surface of the frontsheet 506. In some embodiments, the first encapsulant layer 504*a* of the encapsulant 504 includes a second gap G2. In some embodiments, the second gap G2 is located at or proximate to the hinge region 520. In some embodiments, the second gap G2 extends from an upper surface of the first encapsulant layer 504*a* of the encapsulant 504 to an opposite, lower surface of the first encapsulant layer 504*a*. In some embodiments, the second encapsulant layer 504*b* of the encapsulant 504 includes a third gap G3. In some embodiments, the third gap G3 is located at or proximate to the hinge region 520. In some embodiments, the third gap G3 extends from an upper surface of the second encapsulant layer 504*b* of the encapsulant 504 to an opposite, lower surface of the second encapsulant layer 504*b*. In some embodiments, the first gap G1 has a first width. In some embodiments, the second gap G2 has a second width. In some embodiments, the third gap G3 has a third width. In some embodiments, the first width of the first gap G1 is equal or substantially equal to the second width of the second gap G2. In some embodiments, the first width of the first gap G1 is equal or substantially equal to the third width of the third gap G3. In some embodiments, the second width of the second gap G2 is equal or substantially equal to the third width of the second gap G3. In some embodiments, each of the widths of the first, second, and third gaps G1, G2, G3 are different from one or more of the other widths. In some embodiments, the first, second, and third gaps G1, G2, G3 are aligned or substantially aligned with one another in a vertical or transverse direction. In some embodiments, the first gap G1 is in communication with the second gap G2. In some embodiments, the backsheet 508 extends from the first end 516 to the second end 518. In some embodiments, the backsheet 508 spans and extends across the third gap G3.

In some embodiments, the photovoltaic module 500 includes an electrical connector 530. In some embodiments, the electrical connector 530 electrically connects the first plurality of solar cells 502*a* to the second plurality of solar cells 502*b*. In some embodiments, the electrical connector 530 is mechanically connected to at least one of the first plurality of solar cells 502*a* and at least one of the second plurality of solar cells 502*b*. In some embodiments, the electrical connector 530 spans and extends across the second gap G2 of the first encapsulant layer 504*a* and the third gap G3 of the second encapsulant layer 504*b*. In some embodiments, the electrical connector 530 is between the solar cells 502 and the second encapsulant layer 504*b*. In some embodiments, the electrical connector 530 is an electrical wire, cable, string, stringing wire, busbar, bussing or ribbon. In some embodiments, the electrical connector 530 is a multi-stranded electrical wire. In some embodiments, the electrical connector 530 includes a solid core wire. In some embodiments, the electrical connector 530 is flexible. In some embodiments, the photovoltaic module 500 includes a plurality of the electrical connectors 530. In some embodiments, the diameter of the electrical connector 530 is 100 um to 500 um, e.g., 100 um, 150 um, 200 um, 250 um, 300 um, 350 um, 400 um, 450 um, 500 um, including ranges between any of the foregoing values.

In some embodiments, the photovoltaic module 500 includes a first insulating layer 532. In some embodiments, the first insulating layer 532 is located between the first encapsulant layer 504*a* and the electrical connector 530. In some embodiments, the first insulating layer 532 is above the electrical connector 530. In some embodiments, the first insulating layer 532 is located at or proximate to the hinge region 520. In some embodiments, the first insulating layer 532 spans and extends across the first gap G1 of the frontsheet 506, the second gap G2 of the first encapsulant layer 504*a*, and the third gap G3 of the second encapsulant layer 504*b*. In some embodiments, the first insulating layer 532 has a first length. In some embodiments, the first length is greater than the first width of the first gap G1. In some embodiments, the first length is greater than the second width of the second gap G2. In some embodiments, the first length is greater than the third width of the third gap G3.

Figure 16:
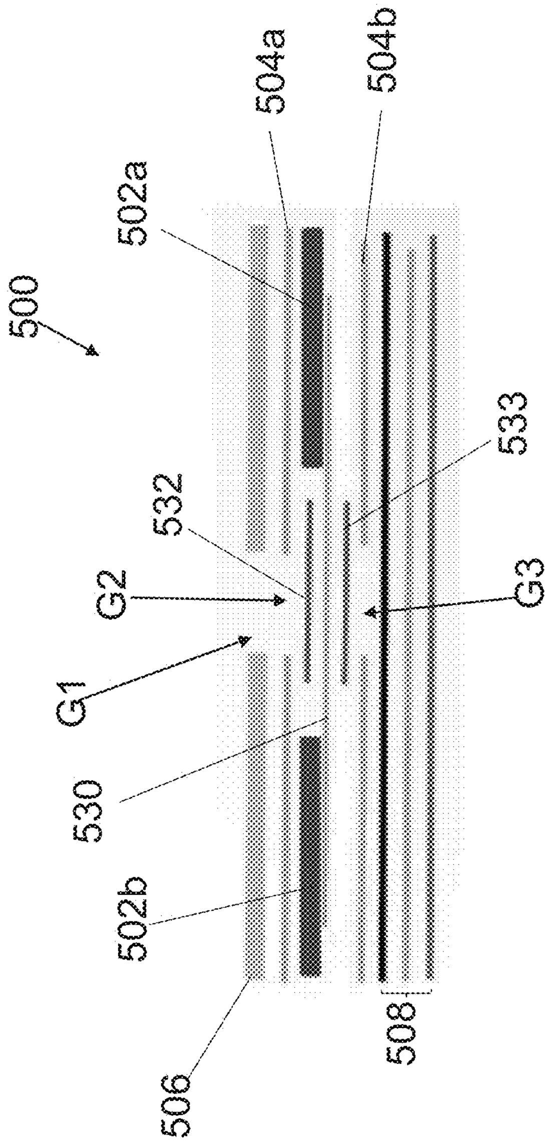

Referring to FIG. 16, in some embodiments, the photovoltaic module 500 includes a second insulating layer 533. In some embodiments, the second insulating layer 533 is located between the second encapsulant layer 504*b* and the electrical connector 530. In some embodiments, the second insulating layer 533 is below the electrical connector 530. In some embodiments, the second insulating layer 533 is below the first insulating layer 532. In some embodiments, the second insulating layer 533 is located at or proximate to the hinge region 520. In some embodiments, the second insulating layer 533 spans and extends across the first gap G1 of the frontsheet 506, the second gap G2 of the first encapsulant layer 504*a*, and the third gap G3 of the second encapsulant layer 504*b*. In some embodiments, the second insulating layer 533 has a second length. In some embodiments, the second length is greater than the first width of the first gap G1. In some embodiments, the second length is greater than the second width of the second gap G2. In some embodiments, the second length is greater than the third width of the third gap G3. In some embodiments, the second length of the second insulating layer 533 is equal to or approximately equal to the first length of the first insulating layer 532. In some embodiments, the photovoltaic module 500 need not include the second insulating layer 533.

In some embodiments, each or both of the first insulating layer 532 and the second insulating layer 533 is composed of a polymer. In some embodiments, each or both of the first insulating layer 532 and the second insulating layer 533 is composed of PET. In some embodiments, each or both of the first insulating layer 532 and the second insulating layer 533 is composed of clear PET. In some embodiments, each or both of the first insulating layer 532 and the second insulating layer 533 is composed of TPO.

In some embodiments, the electrical connector 530 is physically decoupled from the encapsulant 504 locally at the hinge region 520 (flexible hinge location) of the laminate structure of the photovoltaic module 500 by the first gap G1 of the frontsheet 506, the second gap G2 of the first encapsulant layer 504*a*, and the third gap G3 of the second encapsulant layer 504*b*, above and below the string of the solar cells 502. In some embodiments, each of the first insulating layer 532 and the second insulating layer 533 prevents the open gaps G1, G2, G3 from flooding with reflow encapsulant material of the encapsulant 504 during the lamination process of the photovoltaic module 500. In some embodiments, decoupling the outer insulation strain from the electrical connector 530 in the hinge region 520 enables the electrical connector 530 to be subjected to increased bending cycles without strain hardening or cracking. In some embodiments, the increased bending cycles are over 50 cycles.

Figure 17B:
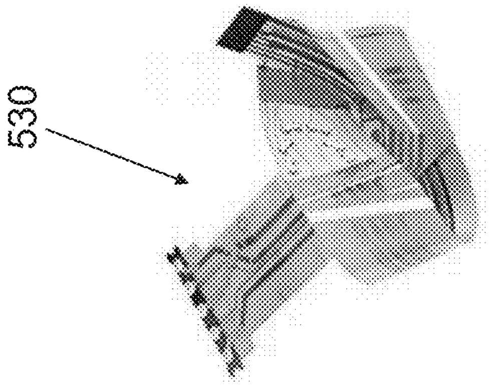
Figure 17A:
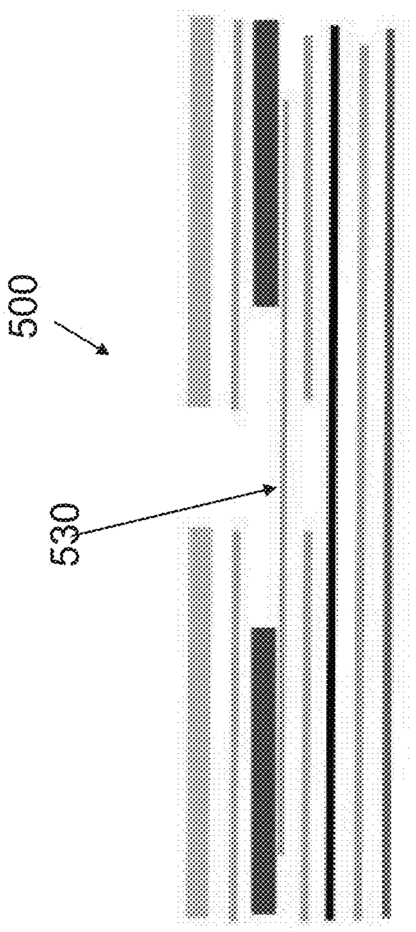

Referring to FIGS. 17A and 17B, in some embodiments, the first insulating layer 532 and the second insulating layer 533 described above need not be included. In some embodiments, the electrical connector 530 is a flexible circuit. In some embodiments, the flexible circuit includes embedded copper traces.

Figure 18:
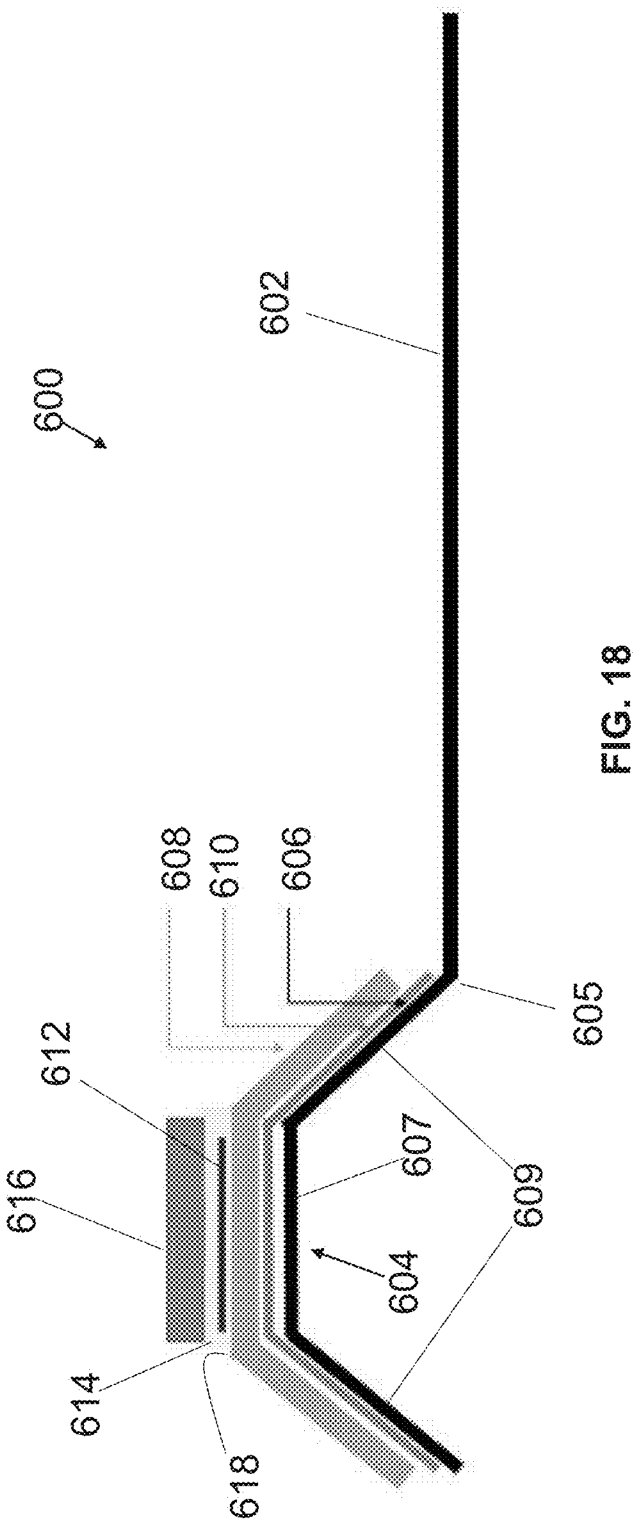
FIGS. 18 through 20 are schematic, cross-sectional views of some embodiments of wireway covers.

Referring to FIG. 18, in some embodiments, a photovoltaic module 600 includes a first portion 602 and second portion 604. In some embodiments, the first portion 602 and the second portion 604 are integral with one another. In some embodiments, the first portion 602 and the second portion 604 are separate components. In some embodiments, the first portion 602 and the second portion 604 are attached to, joined with, or integral with one another at a first location 605. In some embodiments, the first location 605 is a hinged portion. In some embodiments, the photovoltaic module 600 including the first portion 602 and the second portion 604 have a structure, function, components, and features are described above with respect to the embodiments of the photovoltaic module 100, with certain additional features or differences as described herein.

In some embodiments, the second portion 604 is a wireway cover. In some embodiment, the second portion 604 has a curved shaped. In some embodiment, the second portion 604 has a trapezoid cross-sectional shape. In some embodiments, the second portion 604 has a linear, flat upper portion 607 and a pair of sidewalls 609 extending obliquely from the upper portion 607. In some embodiments, the second portion 604 includes a base layer 606 and an outer layer 608 attached to the base layer 606. In some embodiments, the outer layer 608 is attached to the base layer 606 by an adhesive 610. In some embodiments, the outer layer 608 is attached to the base layer 606 by heat welding. In some embodiments, the outer layer 608 is attached to the base layer 606 by ultrasonic welding. In some embodiments, the outer layer 608 is attached to the base layer 606 by thermal bonding.

In some embodiments, the base layer 606 is a composed of a rigid material. In some embodiments, the base layer 606 is composed of a polymer. In some embodiments, the base layer 606 is composed of a reinforced thermoplastic. In some embodiments, the base layer 606 is composed of metal. In some embodiments, the outer layer 608 is composed of a polymer. In some embodiments, the outer layer 608 is composed of thermoplastic polyolefin (TPO).

In some embodiments, the second portion 604 includes at least one solar cell 612. In some embodiments, the at least one solar cell 612 includes a plurality of solar cells 612. In some embodiments, the at least one solar cell 612 is encapsulated by an encapsulant 614. In some embodiments, a frontsheet 616 is above the encapsulant 614. In some embodiments, a frontsheet 616 is adhered to the encapsulant 614. In some embodiments, the frontsheet 616 includes a glass layer. In some embodiment, the frontsheet 616 includes a polymer layer. In some embodiments, the frontsheet 616, the encapsulant 614, and the at least one solar cell 612 are laminated. In some embodiments, the laminated frontsheet 616, the encapsulant 614, and the at least one solar cell 612 are attached to an upper surface 618 of the outer layer 608. In some embodiments, the laminated frontsheet 616, the encapsulant 614, and the at least one solar cell 612 are attached to an upper surface 618 of the outer layer 608 by lamination, an adhesive, welding, bonding or by the encapsulant 614.

Figure 19:
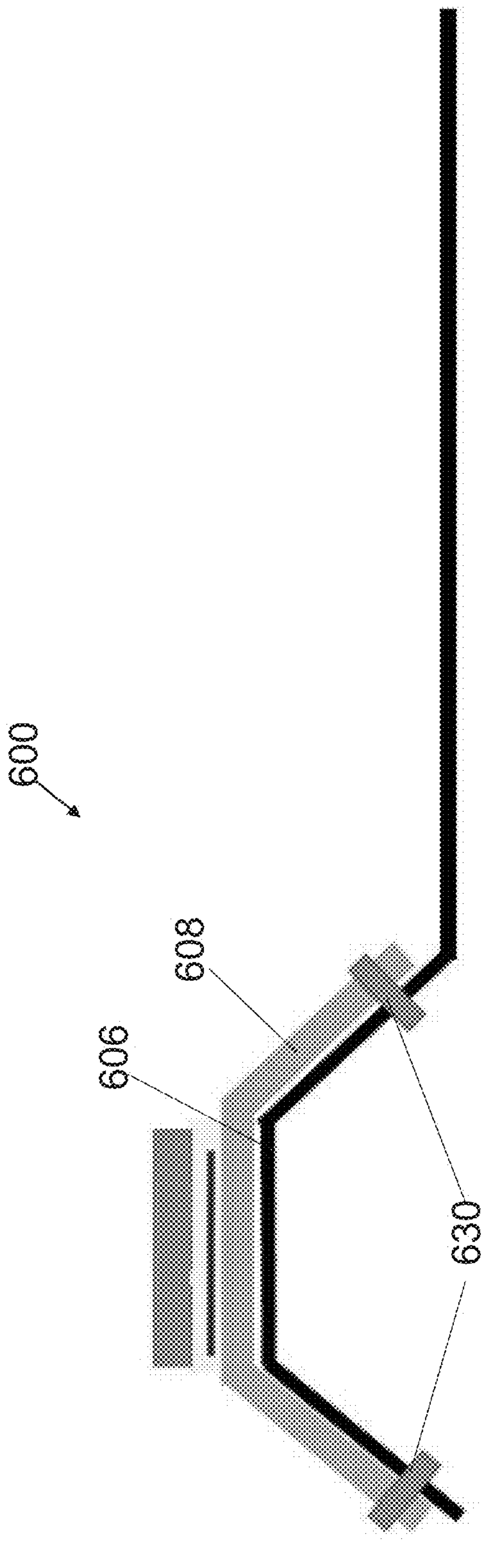
Figure 20:
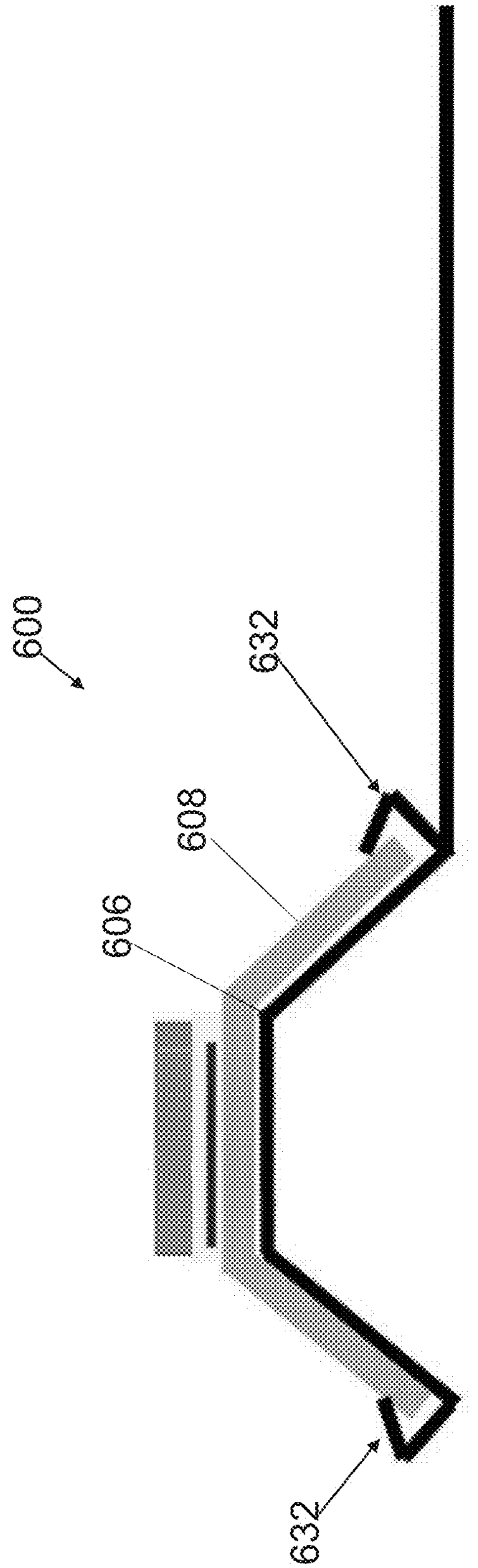

Referring to FIG. 19, in some embodiments, the outer layer 608 is attached to the base layer 606 by at least one fastener 630. In some embodiments, the outer layer 608 is attached to the base layer 606 by a plurality of the fasteners 630. In some embodiments, the at least one fastener 630 includes screws, rivets, bolts, nuts, rods, clips, tabs, snap tabs, and/or other suitable fasteners. Referring to FIG. 20, in some embodiments, the outer layer 608 is attached to the base layer 606 by crimping portions 632 of the base layer 606.

Figure 21B:
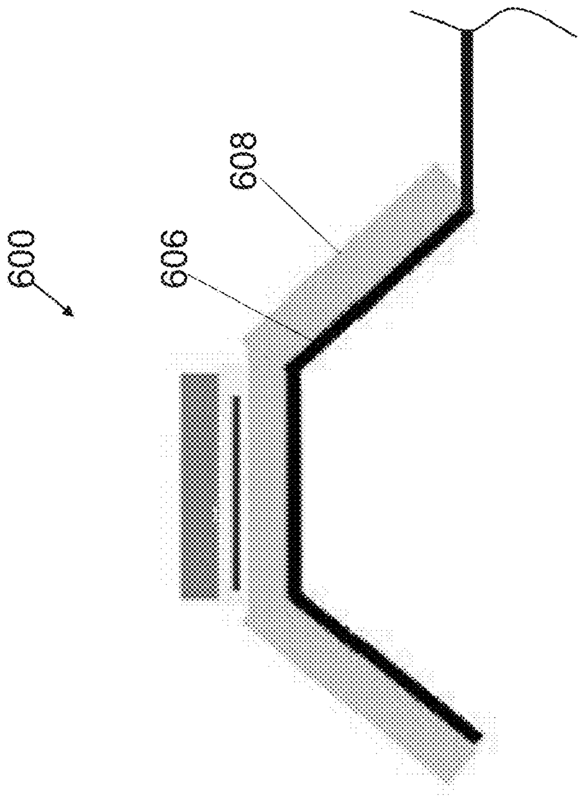
FIGS. 21A and 21B are schematic, cross-sectional views of some embodiments of a method of making a wireway cover.
Figure 21A:
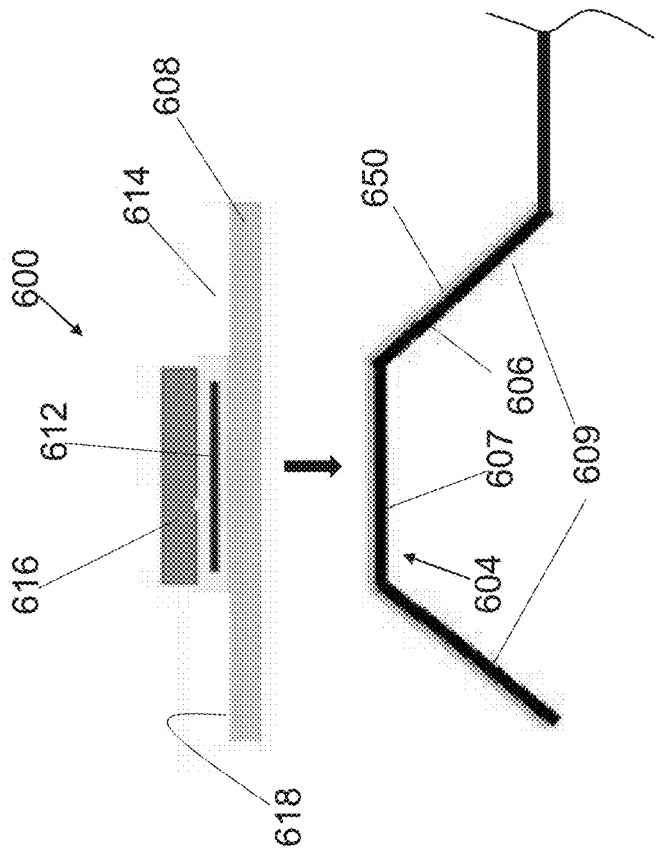

FIGS. 21A and 21B illustrate some embodiments of a method of making or forming the second portion 604. In some embodiments, the second portion 604 includes an inner layer 650 attached to the base layer 606. In some embodiments, the inner layer 650 is composed of a polymer. In some embodiments, the inner layer 650 is composed of thermoplastic polyolefin (TPO). In some embodiments, the inner layer 650 is composed of polyethylene (PE). In some embodiments, the inner layer 650 is composed of high density polyethylene (HDPE). In some embodiments, the inner layer 650 is composed of polyphenylene ether (PPE). In some embodiments, the inner layer 650 is composed of polystyrene (PS). In some embodiments, the inner layer 650 is composed of a blend of polyphenylene ether (PPE) and polystyrene (PS), such as Noryl™ resin. In some embodiments, the base layer 606 and the inner layer 650 are coextruded or co-molded.

In some embodiments, the outer layer 608 is linear or flat or substantially linear or flat prior to installation on and with the base layer 606. In some embodiments, a laminate of the at least one solar cell 612, the encapsulant 614, and the frontsheet 616 is attached to the upper surface 618 of the outer layer 608. In some embodiments, the outer layer 608 is heated. In some embodiments, the outer layer 608 is heated at least to 150° C. In some embodiments, the outer layer 608 is heated above 150° C. In some embodiments, the outer layer 608 is heated with a heater, a heat gun, or by lamination of the outer layer 608 with the solar cell stack, namely, the at least one solar cell 612, the encapsulant 614, and the frontsheet 616. In some embodiments, under the heat, the outer layer 608 softens. In some embodiments, the heated outer layer 608 is applied to and over the inner layer 650 and the base layer 606 and conforms to the shape thereof. In some embodiments, when the temperature of the outer layer 608 is above its material melting point, welding of the outer layer 608 to the inner layer 650 is achieved. In some embodiments, the outer layer 608 is cooled.

Variations, modifications, and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

What is claimed is:

1. A system, comprising: a plurality of photovoltaic modules installed on a roof deck, wherein each of the plurality of photovoltaic modules is a photovoltaic shingle, wherein the roof deck is planar;
- wherein the plurality of photovoltaic modules includes at least a first photovoltaic module and a second photovoltaic module, wherein the first photovoltaic module and the second photovoltaic module are arranged in an array on the roof deck, wherein each of the plurality of photovoltaic modules comprises:
  - a first end, a second end opposite the first end, and a first location between the first end and the second end;
  - a first plurality of solar cells;
  - a second plurality of solar cells, wherein the first plurality of solar cells is in electrical connection with the second plurality of solar cells;
  - an encapsulant layer, wherein the encapsulant layer encapsulates the first plurality of solar cells and the second plurality of solar cells;
  - a frontsheet, wherein the frontsheet is above an upper surface of the encapsulant layer;
  - a backsheet, wherein the backsheet is below a lower surface of the encapsulant layer; and
  - a total of two portions, the two portions consisting of a first portion and a second portion,
    - wherein the first portion is planar and extends longitudinally between the first end and the first location,
    - wherein the backsheet of the first portion completely contacts the roof deck,
    - wherein the second portion is curved and extends longitudinally between the first location and the second end, wherein the second portion includes a wireway,
    - wherein the first plurality of solar cells is positioned within the first portion, and
    - wherein the second plurality of solar cells is positioned within the second portion.

2. The system of claim 1, wherein the backsheet comprises a polymer material.

3. The system of claim 1, wherein the backsheet comprises at least one of a polyolefin elastomer (POE), a dielectric material, a thermoplastic polyolefin (TPO), or a continuous fiber tape (CFT).

4. The system of claim 1, wherein the frontsheet comprises a polymer layer, and a glass layer, wherein the glass layer is juxtaposed with the encapsulant layer.

5. The system of claim 4, wherein the polymer layer comprises at least one of an ethylene tetrafluoroethylene (ETFE) or a polyolefin elastomer (POE).

6. The system of claim 1, wherein the first plurality of solar cells includes at least a first string, wherein the second plurality of solar cells includes at least a second string, wherein the first string extends in a first direction, wherein the second string extends in a second direction, wherein the first direction is different than the second direction.

7. The system of claim 6, wherein the first direction is perpendicular to the second direction.

8. A photovoltaic module, configured as a photovoltaic shingle, comprising:

a first end, a second end opposite the first end, and a first location between the first end and the second end;

a first plurality of solar cells;

a second plurality of solar cells, wherein the first plurality of solar cells is in electrical connection with the second plurality of solar cells; an encapsulant layer, wherein the encapsulant layer encapsulates the first plurality of solar cells and the second plurality of solar cells;

a frontsheet, wherein the frontsheet is above the encapsulant layer;

a backsheet, wherein the backsheet is below a lower surface of the encapsulant layer; and a total of two portions, the two portions consisting of a first portion and a second portion, wherein the first portion is planar and extends longitudinally between the first end and the first location, wherein the second portion is curved and extends longitudinally between the first location and the second end, wherein the first plurality of solar cells is positioned within the first portion, and wherein the second plurality of solar cells is positioned within the second portion, wherein the photovoltaic module is configured to be installed on a planar roof deck, and wherein the backsheet of the first portion is configured to completely contact the planar roof deck.

9. The photovoltaic module of claim 8, wherein the backsheet comprises a polymer material.

10. The photovoltaic module of claim 8, wherein the backsheet comprises at least one of a polyolefin elastomer (POE), a dielectric material, a thermoplastic polyolefin (TPO), or a continuous fiber tape (CFT).

11. The photovoltaic module of claim 8, wherein the frontsheet comprises a polymer layer, and a glass layer, wherein the glass layer is juxtaposed with the encapsulant layer.

12. The photovoltaic module of claim 11, wherein the polymer layer comprises at least one of an ethylene tetrafluoroethylene (ETFE) or a polyolefin elastomer (POE).

13. The photovoltaic module of claim 8, wherein the first plurality of solar cells includes at least a first string, wherein the second plurality of solar cells includes at least a second string, wherein the first string extends in a first direction, wherein the second string extends in a second direction, wherein the first direction is different than the second direction.

14. The photovoltaic module of claim 13, wherein the first direction is perpendicular to the second direction.

15. A system, comprising:

a plurality of photovoltaic modules installed on a planar roof deck, wherein each of the plurality of photovoltaic modules is a photovoltaic shingle, wherein the plurality of photovoltaic modules includes at least a first photovoltaic module and a second photovoltaic module, wherein the first photovoltaic module and the second photovoltaic module are arranged in an array on the roof deck, wherein each of the plurality of photovoltaic modules comprises:

a first end, a second end opposite the first end, and a first location between the first end and the second end;

a first plurality of solar cells;

a second plurality of solar cells, wherein the first plurality of solar cells is in electrical connection with the second plurality of solar cells;

an encapsulant layer, wherein the encapsulant layer encapsulates the first plurality of solar cells and the second plurality of solar cells;

a frontsheet, wherein the frontsheet is above an upper surface of the encapsulant layer;

a backsheet, wherein the backsheet is below a lower surface of the encapsulant layer; and a total of two portions, the two portions consisting of a first portion and a second portion, wherein the first portion is planar and extends longitudinally between the first end and the first location, wherein the backsheet of the first portion completely contacts the planar roof deck, wherein the second portion is curved and extends longitudinally between the first location and the second end, wherein the second portion includes a wireway, wherein the first plurality of solar cells is positioned within the first portion, and wherein the second plurality of solar cells is positioned within the second portion, wherein the frontsheet comprises a polymer layer, and a glass layer, wherein the glass layer is juxtaposed with the encapsulant layer.

* * * * *